(12) United States Patent
Minami et al.

(10) Patent No.: US 6,607,381 B2
(45) Date of Patent: Aug. 19, 2003

(54) AUXILIARY HEAT-INSULATING JIG

(75) Inventors: Masashi Minami, Hyogo (JP); Ikuo Katsurada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/053,551

(22) Filed: Jan. 24, 2002

(65) Prior Publication Data

US 2002/0172908 A1 Nov. 21, 2002

(30) Foreign Application Priority Data

May 16, 2001 (JP) ........................................ 2001-145956

(51) Int. Cl.⁷ ............................................... F27D 5/00
(52) U.S. Cl. ..................... 432/258; 211/41.18; 427/255
(58) Field of Search ................... 432/253, 258, 432/5, 7; 211/41.18; 206/454; 427/255, 409; 118/715, 720

(56) References Cited

U.S. PATENT DOCUMENTS

| 5,370,371 A | * | 12/1994 | Miyagi et al. ............... 266/256 |
| 5,709,543 A | * | 1/1998 | Shimazu ....................... 432/241 |
| 5,938,852 A | * | 8/1999 | Nam et al. ................... 118/724 |

FOREIGN PATENT DOCUMENTS

| JP | 7-6976 | 1/1995 |
| JP | 9-74071 | 3/1997 |
| JP | 3069350 | 5/2000 |

* cited by examiner

*Primary Examiner*—Gregory Wilson
(74) *Attorney, Agent, or Firm*—McDermott, Will & Emery

(57) ABSTRACT

An auxiliary heat-insulating jig is provided between a wafer boat and a heat-insulating jig. The auxiliary heat-insulating jig comprises a plurality of vertically arranged plate insulators. The plate insulators are made of opaque quartz. Thus, an auxiliary heat-insulating jig necessary for modifying a high-speed temperature-control heat treatment apparatus of an intermediate temperature specification to a high-speed temperature-control heat treatment apparatus of a high-temperature specification is provided.

10 Claims, 38 Drawing Sheets

XXXB-XXXB SECTION

AUXILIARY HEAT-INSULATING JIG

BACKGROUND OF THE INVENTION

1. Field of the Invention

The present invention generally relates to an auxiliary heat-insulating jig, and more specifically, it relates to an auxiliary heat-insulating jig improved to be capable of increasing an adiabatic effect. The present invention also relates to a method of manufacturing an auxiliary heat-insulating jig improved to increase an adiabatic effect. The present invention further relates to a vertical heat treatment apparatus having such an auxiliary heat-insulating jig.

2. Description of the Prior Art

A semiconductor device such as a MOS-LSI or a bipolar LSI is fabricated through a number of heat treatment steps such as an oxidation step, a CVD step and a diffusion step. Following the recent progress of the semiconductor device fabrication technique, a general process apparatus is mainly formed by a single wafer processing apparatus. On the site of production, about 25 silicon wafers for forming semiconductor devices are generally treated as a single lot. Thus, the single wafer processing apparatus treats and physically distributes silicon wafers lot by lot.

On the other hand, a vertical heat treatment apparatus requiring a long treatment time generally treats and physically distributes at least 100 silicon wafers, i.e., at least four lots of silicon wafers at a time, while a vertical heat treatment apparatus called a high-temperature heat treatment furnace capable of reducing the treatment time can treat and physically distribute a lot of silicon wafers at a time.

When a vertical heat treatment apparatus such as a vertical transformation CVD (chemical vapor deposition) furnace is employed in heat treatment steps, silicon wafers for forming semiconductor devices are loaded on a vertical heat treatment wafer boat of quartz or SiC and inserted into a reaction tube of the vertical heat treatment apparatus. A number of silicon wafers can be vertically loaded on the vertical heat treatment wafer boat at proper intervals in a horizontally kept state. In this case, the vertical heat treatment wafer boat is generally set on a heat-insulating jig referred to as a heat-insulating cylinder.

This heat-insulating jig is set between the vertical heat treatment wafer boat and a cap (a component serving as the lid of the reaction tube during heat treatment). The heat-insulating jig prevents heat in the reaction tube from escaping from a throat by thermal conduction while preventing a sealing member for the cap and a rotation mechanism of the wafer bat from deterioration or breakage caused by radiant heat. Therefore, a heat-insulating cylinder having large thermal capacity is employed in a high-temperature vertical heat treatment furnace.

The heat-insulating cylinder may be provided in various shapes. Referring to FIG. 37, for example, an opaque quartz cylinder 324 stores an insulator 323 prepared by deairing a quartz capsule 321 and sealing the same with flocculently rounded quartz wool 322. This opaque quartz cylinder 324 is generally applied to a furnace of a relatively high-temperature specification.

Referring to FIG. 38, a heat-insulating jig formed by vertically arranging several opaque quartz discs of about 5 mm in thickness at intervals of several cm is also known.

Referring to FIG. 39, an opaque quartz cylinder 392 storing several vertically arranged opaque quartz discs 391 is also proposed.

Referring to FIG. 40, a large cylinder 401 storing alternately stacked discs 7 and cylinders 36 (not welded) is also known.

FIG. 41 shows a low-temperature heat-insulating cylinder set on a boat. FIG. 42 shows a high-temperature heat-insulating cylinder set on a boat. The heat-insulating cylinder shown in FIG. 41 is applied to a furnace employed at a relatively low temperature, and the heat-insulating cylinder shown in FIG. 42, prepared from that shown in FIG. 37, is applied to a furnace employed at a relatively high temperature.

While opaque quartz is the optimum material for the heat-insulating cylinder, transparent quartz may be additionally employed as an auxiliary material.

A material prepared by storing a silicon wafer in a deaired or nitrogen-sealed quartz glass member for preventing the silicon wafer from oxidation is also proposed as an insulator. This material, proposed on the basis of such a supposition that the silicon wafer having a mirror-finished surface may reflect approximately 100% of radiant heat, reflects visible light. However, the material absorbs infrared light and the silicon wafer is immediately heated to cause heat radiation again, and hence this material is improper for application to an insulator.

Some materials of silicon carbide (hereinafter referred to as SiC) are proposed as ideas. However, it is to be noted that the thermal conductivity of SiC is 45 to 125 W/m.k, i.e., at least 20 to 60 times that of quartz glass. SiC must be regarded as a remarkably excellent thermal conductor, and an expression "insulating or heat-shielding plate of SiC" means "heat-shielding plate having excellent thermal conductivity" in other words. This expression is unsubstantial and misleading wording confusing users similarly to "insulator excellently conducting electricity", since SiC has no heat-shielding effect in practice. A thin plate of SiC used in any of the aforementioned ideas may be used not for heat shielding but for a purpose of attaining an effect of rectifying reaction gas, for example, and must have a more proper name than a heat-shielding plate. For example, the thin plate of SiC may be properly referred to as a rectifying plate or a dummy wafer. In a vertical heat treatment apparatus, SiC having excellent thermal conductivity is mainly employed as the material for a soaking pipe.

Recently, a general vertical heat treatment apparatus having a track temperature increase speed of not more than 8° C./min. and a track temperature reduction speed of not more than 3° C./min. is being replaced with a vertical heat treatment apparatus, referred to as a high-speed temperature-control furnace, having a track temperature increase speed of at least 45° C./min. and a track temperature reduction speed of at least 15° C./min.

Such a high-speed temperature-control furnace employs a heat-insulating jig having small thermal capacity so that the temperature control speed is not reduced.

When such a heat-insulating jig is employed, heat escapes from a bottom area of a wafer boat in a temperature region exceeding 1000° C. Therefore, the heat-insulating jig requires a long time for reaching a target temperature exceeding 1000° C. and entering a stable state.

Also in a range where the heat-insulating jig can reach the target temperature, heat escapes from a portion around the bottom, and hence a heater for the bottom portion is regularly in a state substantially at full power. Therefore, thermal stress is applied to a wafer treated in the vicinity of the bottom, to cause crystal defects called slips in the wafer.

For example, Japanese Patent Laying-Open No. 9-74071 (1997) proposes a heat-insulating jig formed by arranging a plurality of thin heat-shielding plates as a heat-insulating jig capable of reducing thermal capacity. The material for this heat-insulating jig is SiC. As to employment of quartz, the gazette shows such a negative view that quartz may be selected if the thickness of a quartz member can be technically reduced.

As described above, SiC absorbing infrared rays and having excessively small thermal capacity has a small adiabatic effect. Therefore, SiC cannot be used as a heat-shielding material even in a furnace of a relatively low-temperature specification such as a CVD furnace. In other words, radiant heat (transmitted radiant heat and re-radiation) and heat conduction from a material referred to as a heat-shielding plate of SiC disadvantageously deteriorate or disappear a sealing member of a heat treatment furnace or break down a rotation mechanism of a wafer boat.

The inventors have reached an idea of adding an auxiliary heat-insulating jig to a heat-insulating jig employed in a general furnace of an intermediate temperature specification, in order to improve an adiabatic effect. As means of suppressing increase of thermal capacity with an excellent adiabatic effect, the inventors have noted the aforementioned heat-insulating jig shown in FIG. 38 formed by vertically arranging several opaque quartz discs at intervals.

Quartz glass absorbs light of 2200 nm and 2700 nm in wavelength resulting from OH groups present therein. However, quartz glass hardly absorbs light of other wavelengths up to an infrared region of 3400 nm. In the field of optical communication employing infrared rays of 1.55 $\mu$m in wavelength, therefore, quartz glass is employed as the material for an optical fiber member serving as a transmission medium.

Heat is shielded through reflection of light on a surface due to the difference between the refractive indices of an in-furnace atmosphere and quartz glass. Opaque quartz glass including small bubbles therein has a larger surface area contributing to reflection than transparent quartz glass. Therefore, opaque quartz glass is widely employed as an insulator.

The heat-insulating jig shown in FIG. 38 is not for a high temperature. When a plate insulator of 5 mm in thickness, for example, is divided into plates of 1 mm in thickness, however, the surface area is increased to about five times in outline while thermal capacity remains unchanged. The inventors have considered that a number of such thin plate insulators may be employed in a high-temperature region when superposed with each other. The inventors have also considered that a space capable of receiving an auxiliary heat-insulating jig is limited and hence an auxiliary heat-insulating jig having a high adiabatic effect can be obtained by reducing the intervals between the plate insulators as compared with those in the prior art while leaving the thermal capacity intact. However, the following problems have been recognized in relation to preparation of such an auxiliary heat-insulating jig:

When reduced in thickness, heat-insulating quartz discs are deformed by their own weight during high-temperature treatment. In order to prevent such deformation, therefore, supports for the heat-insulating quartz discs are preferably set up in the vicinity of points minimizing the moments of the discs and welded to the discs. However, the intervals between the discs are so small that a welding tool cannot reach welded portions. Therefore, the supports and the discs cannot be welded to each other.

When the supports are arranged on the outer sides of the discs and welded to the discs, the discs must be warmed by a burner in welding so that quartz glass is not cracked. However, necessary portions cannot be sufficiently warmed due to the narrow intervals, and quartz glass is cracked if the supports and the discs are forcibly welded in such a situation. Therefore, the supports and the discs cannot be welded to each other in this case either.

Even if the intervals between the discs are increased for enabling welding, there is a high possibility that the thin quartz glass discs are immediately cracked when broiled with the burner. In order to warm the thin discs with the burner, therefore, sophisticated skill or specific equipment as well as a high cost are required while the yield is reduced in this case. When plate insulators are reduced in thickness, further, thermal deformation or breakage is readily caused to reduce the endurance time.

A conceivable method of manufacturing an auxiliary heat-insulating jig as compactly as possible within the conventional technical range is described with reference to FIGS. 43 to 46.

Referring to FIGS. 43 to 46, spacers 9 and plate insulators 7 are first prepared in necessary numbers.

Referring to FIG. 43, three supports 6 are vertically set up on a bottom plate 8, to be welded and fixed to the bottom plate 8 with an oxyhydrogen burner 17.

As shown in FIG. 44, lowermost spacers 13 are engaged with the supports 6. The lowermost spacers 13 are provided with holes for receiving the supports 6. The inner sides of the holes provided in the lowermost spacers 13 are tapered (not shown), not to interfere with portions connecting the bottom plate 8 and the supports 6 with each other.

Referring to FIG. 45, the lowermost plate insulator 7 is engaged with the supports 6, for receiving the spacers 9 thereon. The plate insulator 7 and the spacers 9 are also provided with holes for receiving the supports 6 respectively. Thus, the plate insulators 7 and the spacers 9 are alternately engaged with the supports 6 by necessary numbers, so that the supports 6 and a top plate 18 are welded to each other with the oxyhydrogen burner 17 after the uppermost plate insulator 7 is engaged with the supports 6, as shown in FIG. 46. Thereafter annealing is performed for removing strain caused during welding. FIG. 46 shows the final shape of the auxiliary heat-insulating jig.

Referring to FIG. 46, the interval between the top plate 18 and the uppermost plate insulator 7, which must be welded to each other with the burner 17, cannot be further reduced.

The inventive heat-insulating jig, to be inserted between an existing heat-insulating jig and a boat, is limited in settable height and hence no unnecessary space must be left.

The heat-insulating cylinder shown in FIG. 42 employing the heat-insulating jig shown in FIG. 40 has a possibility of thinly forming the plate insulators 7 and the spacers 36 provided inside the heat-insulating cylinder and stacking a number of plate insulators 7. In this case, however, the number of the stacked plate insulators 7 is increased, leading to unstableness. Therefore, a wafer boat set on the heat-insulating cylinder may disadvantageously fall, and hence this structure cannot be employed in consideration of safety.

The apparatus also has its own problem. A high-speed temperature-control furnace cannot perform treatment at 1100° C. Therefore, a step of recovering crystal defects or the like by annealing requires heat treatment at a temperature of at least 1100° C. for about 60 minutes. However, a general diffusion furnace requires a long time for temperature control, leading to a long treatment time. In order to maintain the throughput, therefore, the high-speed temperature-control furnace treats a plurality of lots at a time. However, the high-speed temperature-control furnace transfers the treated substances lot by lot in all of the remaining steps, leading to inferior production balance.

SUMMARY OF THE INVENTION

The present invention has been proposed in order to solve the aforementioned problems, and an object thereof is to provide an auxiliary heat-insulating jig necessary for producing a high-speed temperature-control furnace capable of performing high-temperature treatment.

Another object of the present invention is to provide an auxiliary heat-insulating jig capable of preventing plate insulators from breakage caused by welding and improving assembling workability.

Still another object of the present invention is to provide an auxiliary heat-insulating jig reducing the thickness of plate insulators to the level of the thickness of wafers, exhibiting small increase of thermal capacity and having a high adiabatic effect.

A further object of the present invention is to provide an auxiliary heat-insulating jig withstanding a high temperature, having a structure not thermally deforming thin plate insulators.

A further object of the present invention is to provide a method of thinly finishing plate insulators to the level of the thickness of wafers.

A further object of the present invention is to provide a wafer boat provided with plate insulators by mounting thin plate insulators on the wafer boat so that the wafer boat itself has an adiabatic function.

A further object of the present invention is to provide a vertical heat treatment apparatus capable of treating and operating all devices in semiconductor device fabrication steps lot by lot in a physical distribution unit and improved to be capable of increasing productivity of a total factory.

A further object of the present invention is to provide a modification method for obtaining such a vertical heat treatment apparatus.

A further object of the present invention is to provide a method of fabricating a semiconductor device with such a vertical heat treatment apparatus.

An auxiliary heat-insulating jig according to a first aspect of the present invention is provided between a wafer boat and a heat-insulating jig in a vertical heat treatment apparatus comprising the wafer boat and the heat-insulating jig. This auxiliary heat-insulating jig comprises a plurality of vertically arranged plate insulators. The aforementioned plate insulators are made of opaque quartz.

According to a preferred embodiment of the present invention, the auxiliary heat-insulating jig comprises a base and a plurality of supports vertically set up on the aforementioned base. Fixing means are provided on the respective ones of the aforementioned plurality of plate insulators for fixing the plurality of plate insulators in association with the aforementioned supports. A spacer is detachably inserted between each pair of the aforementioned plurality of vertically arranged plate insulators for defining a clearance therebetween.

According to another preferred embodiment of the present invention, the aforementioned fixing means include:

(a) through holes vertically passing through the aforementioned plate insulators, (b) U-shaped notches provided on the outer peripheral portions of the aforementioned plate insulators for receiving side portions of the aforementioned supports, (c) semicircular notches provided on the outer peripheral portions of the aforementioned plate insulators for receiving side portions of the aforementioned supports, or (d) rectangular notches provided on the outer peripheral portions of the aforementioned plate insulators for receiving side portions of the aforementioned supports.

According to still another preferred embodiment of the present invention, the thickness of the aforementioned plate insulators is rendered substantially identical to the thickness of a semiconductor substrate. The thickness of the aforementioned plate insulators is rendered substantially identical to the thickness of a semiconductor substrate, whereby the surface areas of the plate insulators are increased with respect to the volumes, for increasing reflectivity for infrared rays.

According to a further preferred embodiment of the present invention, reinforcing parts reinforcing the aforementioned plate insulators are provided on at least single surfaces of the plate insulators, and the aforementioned reinforcing parts are integrally formed with the aforementioned plate insulators.

According to a further preferred embodiment of the present invention, the aforementioned reinforcing parts include:

(a) portions, having a larger thickness than the remaining portions, radially extending from the central portions of the aforementioned plate insulators, and/or (b) portions, having a larger thickness than the remaining portions, forming circumferences apart from the central portions of the aforementioned plate insulators.

According to a further preferred embodiment of the present invention, the auxiliary heat-insulating jig further comprises a base, a plurality of supports vertically set up on the aforementioned base and fixing means provided on the respective ones of the aforementioned plurality of plate insulators for fixing the plurality of plate insulators in association with the aforementioned supports. The aforementioned plurality of plate insulators are engaged into the auxiliary heat-insulating jig through the aforementioned fixing means, to be fixed.

An auxiliary heat-insulating jig according to a second aspect of the present invention is mounted on a wafer boat. The aforementioned wafer boat comprises a support provided on its side wall with a plurality of vertically arranged first notches for receiving semiconductor substrates in the first notches and supporting the semiconductor substrates. This auxiliary heat-insulating jig comprises a plurality of vertically arranged plate insulators having a thickness rendered substantially identical to the thickness of the aforementioned semiconductor substrates and provided with reinforcing parts on at least single surfaces thereof. Second notches are provided on the outer peripheral portions of the aforementioned plate insulators for receiving an extension part of the aforementioned support to be capable of fixing the aforementioned plurality of plate insulators by engaging the aforementioned second notches in first notches provided in the extension part of the aforementioned support.

A wafer boat provided with plate insulators according to a third aspect of the present invention has an auxiliary heat-insulating jig mounted thereon. The aforementioned auxiliary heat-insulating jig includes a plurality of vertically arranged plate insulators. The aforementioned plate insulators are made of opaque quartz.

A vertical heat treatment apparatus according to a fourth aspect of the present invention comprises a wafer boat having an auxiliary heat-insulating jig mounted thereon. The aforementioned auxiliary heat-insulating jig includes a plurality of vertically arranged plate insulators. The aforementioned plate insulators are made of opaque quartz.

A vertical heat treatment apparatus according to a fifth aspect of the present invention comprises a wafer boat having an auxiliary heat-insulating jig mounted thereon. The aforementioned auxiliary heat-insulating jig includes a plurality of vertically arranged plate insulators. The aforementioned plate insulators are made of opaque quartz.

In a method of manufacturing an auxiliary heat-insulating jig according to a sixth aspect of the present invention, a rectangular block made of quartz glass is first prepared. A quartz glass plate is cut out from the aforementioned rectangular block. The aforementioned quartz glass plate is polished for forming a thin plate insulator.

A method of modifying a vertical heat treatment apparatus according to a seventh aspect of the present invention is a method of modifying a high-speed temperature-control heat treatment apparatus of an intermediate temperature specification to a high-speed temperature-control heat treatment apparatus of a high-temperature specification. This method employs a wafer boat provided with plate insulators. The aforementioned wafer boat provided with plate insulators has an auxiliary heat-insulating jig mounted thereon. The aforementioned auxiliary heat-insulating jig includes a plurality of vertically arranged plate insulators. The aforementioned plate insulators are made of opaque quartz.

A method according to an eight aspect of the present invention is a method of fabricating a semiconductor device employing the vertical heat treatment apparatus having the aforementioned characteristics.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

First, an experiment for confirming effects of the present invention was carried out. This experiment was mainly made for comparing a heat-insulating jig according to a first embodiment of the present invention and a conventional heat-insulating jig with each other. This experiment is now described, followed by description of an auxiliary heat-insulating jig according to the first embodiment of the present invention.

Figure 47:
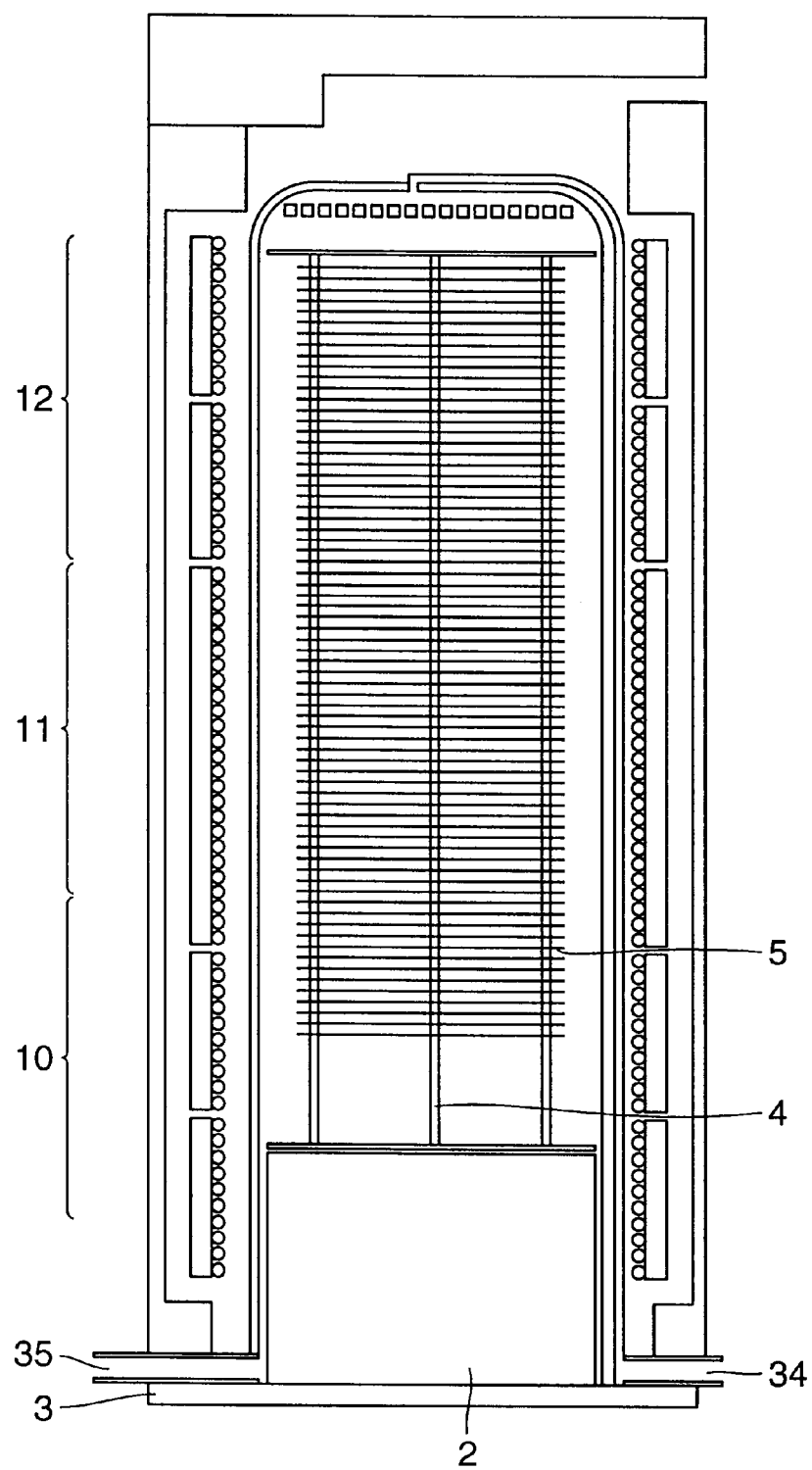
FIG. 47 is a sectional view of a treatment chamber heat-treating wafers in a conventional vertical heat treatment apparatus.

FIG. 47 is a sectional view of a reaction furnace of a conventional vertical heat treatment apparatus treating silicon wafers 5.

Referring to FIG. 47, a wafer boat 4 is provided on a heat-insulating jig 2. The reaction furnace is closed with a shutter 3. The silicon wafers 5 are fixed to the wafer boat 4. The reaction furnace is vertically divided into three zones, i.e., a bottom zone 10, a center zone 11 and a top zone 12. In this experiment, a monitor wafer 5 was introduced into each of the bottom zone 10, the center zone 11 and the top zone 12 and subjected to heat treatment.

Figure 48:
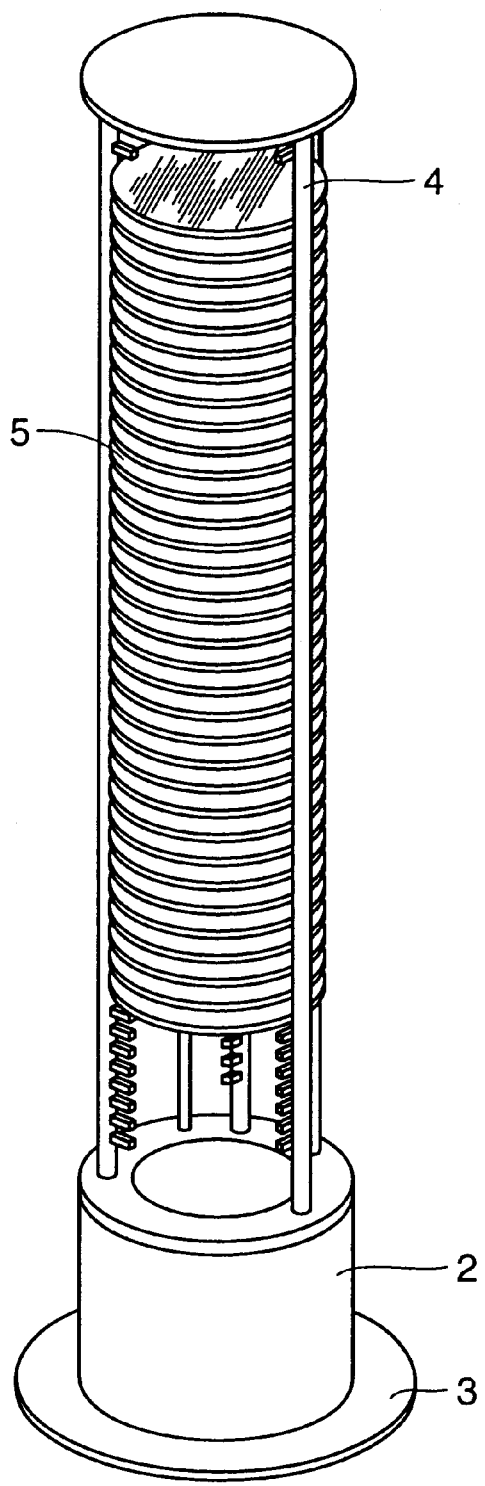
FIG. 48 is a perspective view showing a wafer boat placed on a conventional heat-insulating jig.

FIG. 48 is a perspective view of a comparative apparatus formed by assembling a conventional heat-insulating jig 2, a shutter 3 and a wafer boat 4.

Figure 1:
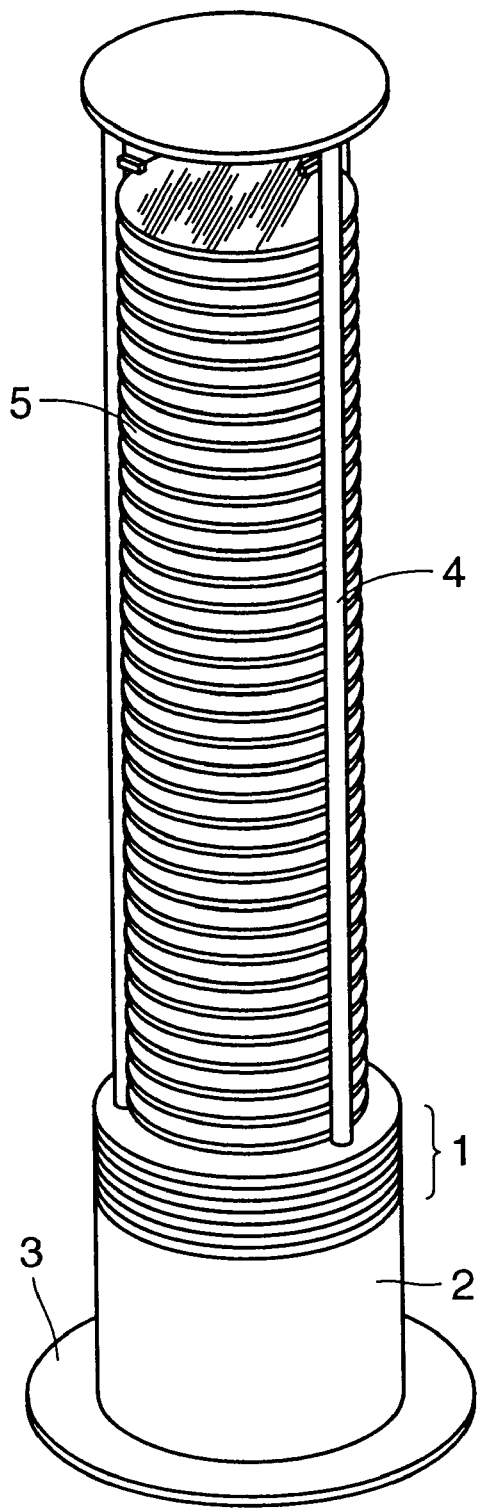
FIG. 1 is a perspective view of a heat treatment apparatus employing an auxiliary heat-insulating jig according to the present invention.

FIG. 1 is a perspective view of an apparatus formed by assembling a shutter 3, a heat-insulating jig 2, an auxiliary heat-insulating jig 1 and a wafer boat 4 according to the first embodiment of the present invention. The auxiliary heat-insulating jig 1 according to the first embodiment is inserted between the heat-insulating jig 2 and the wafer boat 4 of the conventional apparatus shown in FIG. 48. The total heights of the conventional apparatus and the apparatus according to this embodiment are identical to each other.

The experiment was made by investigating the states of occurrence of crystal defects referred to as slips on the monitor wafer 5 heat-treated in the bottom zone 10 at temperatures of 950° C., 1000° C., 1050° C. and 1100° C., i.e., in units of 50° C. Under this condition, there was no such a phenomenon that slips were caused only in the bottom zone 10 and not caused in the top zone 12 and the center zone 11. No slips were caused in the three zones 10, 11 and 12 at the temperature of 950° C. Difference in strength of slips was observed at the temperature of 1000° C. Therefore, a comparison experiment was made at the temperature of 1000° C.

Treatment conditions are as follows:

(1) Heat Treatment Conditions

Insertion Temperature: 400° C.

Temperature Increase Speed: 45° C./min. from 400° C. to 900° C. and 20° C./min. from 900° C. to 1000° C.

Held at 1000° C. for one hour in an $N_2$ atmosphere

Temperature Reduction Speed: 10° C./min. from 1000° C. to 900° C. and 15° C./min. from 900° C. to 400° C.

Drawing Temperature: 400° C.

Figure 2:
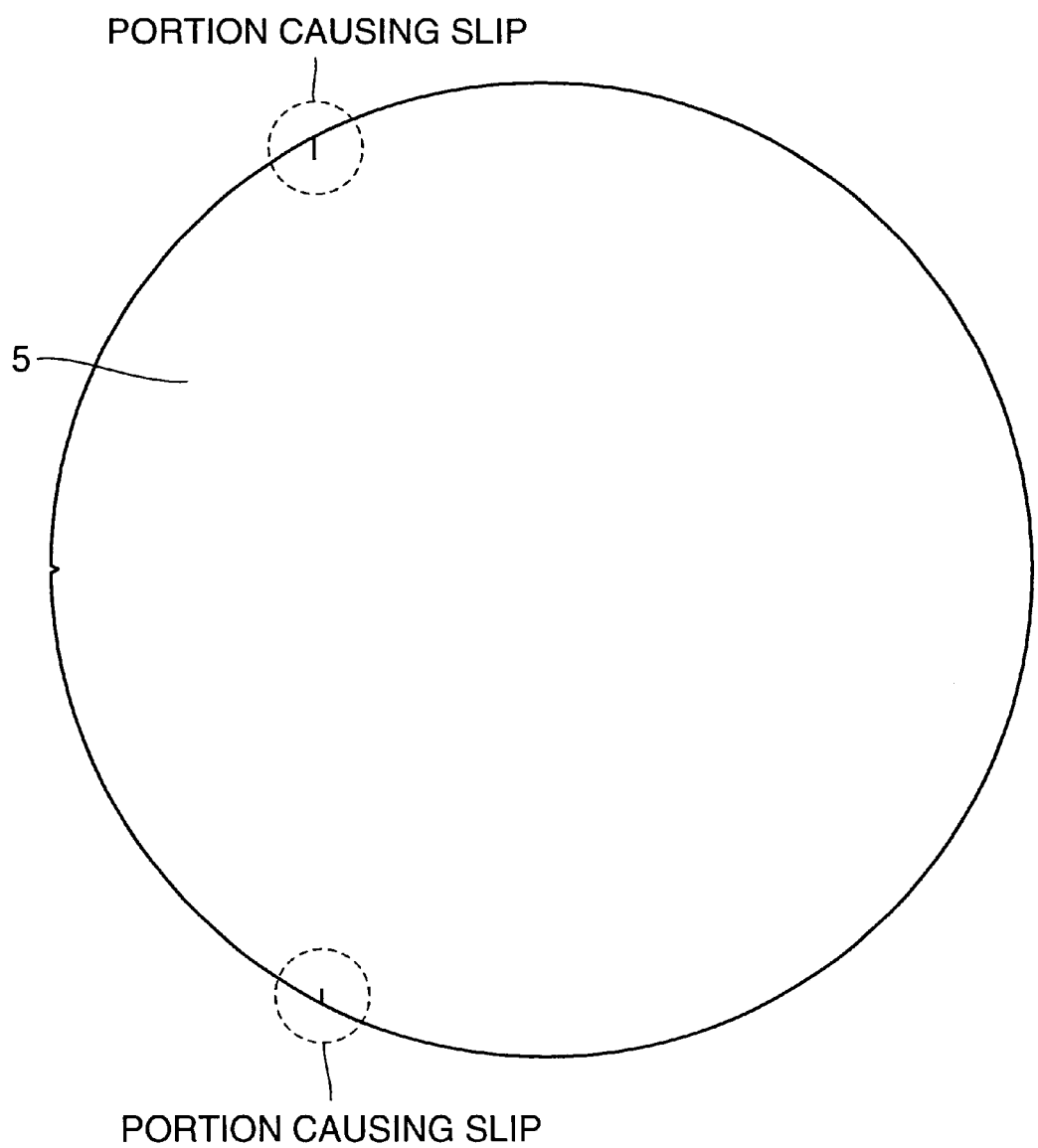
FIG. 2 shows an image of a wafer, heat-treated with a conventional heat-insulating jig at 1000° C., located on a center position taken by an X-ray topographical system.

(2) Monitor Wafer: product by Mitsubishi Materials Corporation, 300 mm in diameter, P-type crystal axis <100>, specific resistance: 10 to 15 Ωcm, oxygen concentration: $1.1 \pm 0.1 \times 10^{18}/cm^3$ (3) Slips: observed with an X-ray topographical system by Rigaku Denki-Sha When the heat-insulating system shown in FIG. 48 was employed, slips of about 3 mm in length were caused in a monitor wafer 5 treated in the top and center zones 12 and 11 on portions corresponding to right and left portions of a monitor wafer support of the wafer boat 4, as shown in FIG. 2. On the other hand, slips of about 10 mm were caused on a monitor wafer 5 treated in the bottom zone 10, as shown in FIG. 3.

Figure 4:
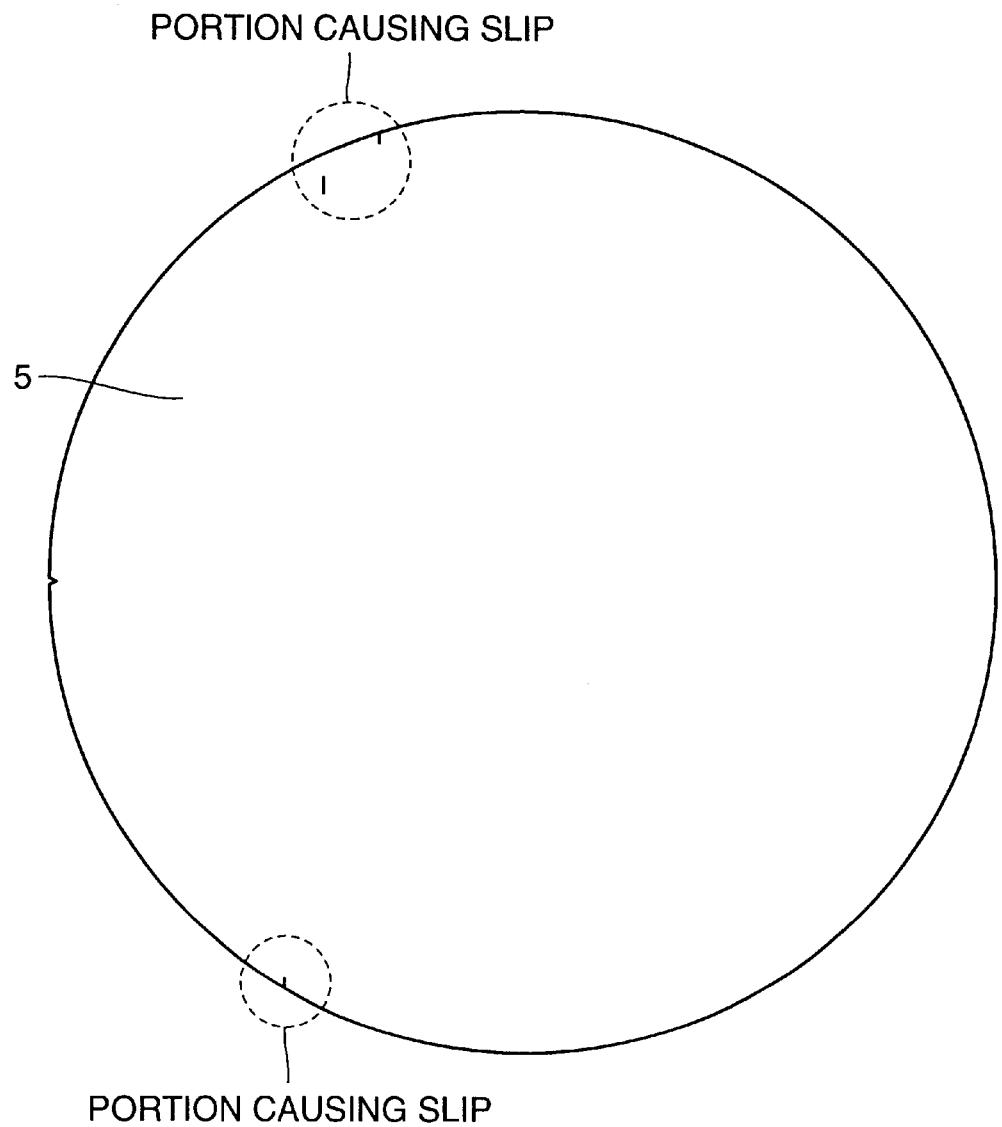
FIG. 4 shows an image of a wafer, heat-treated with the auxiliary heat-insulating jig according to the present invention at 1000° C., located on a bottom position taken by the X-ray topographical system.

FIG. 4 shows a monitor wafer 5 treated in the bottom zone 10 with the heat-insulating system shown in FIG. 1.

Figure 3:
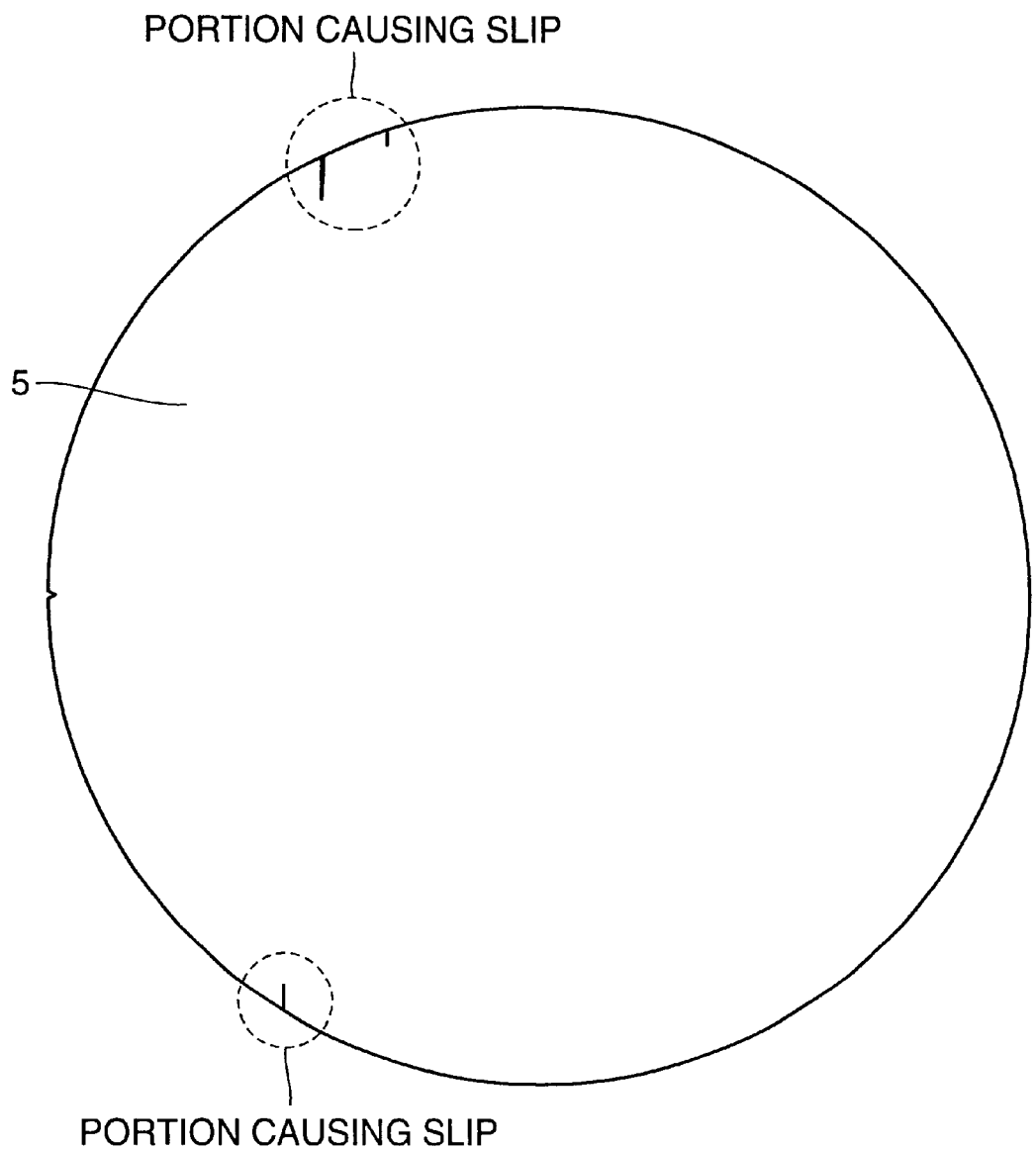
FIG. 3 shows an image of a wafer, heat-treated with the conventional heat-insulating jig at 1000° C., located on a bottom position taken by the X-ray topographical system.

Referring to FIG. 4, slips were caused on the same portions as those in FIG. 3, with the maximum slip length of not more than 4 mm. In other words, it has been confirmed that the monitor wafer 5 is equivalently heat-treated in the three zones 10 to 12 when the auxiliary heat-insulating jig 1 according to the present invention is employed. In other words, heat can be prevented from escaping from the bottom zone 10.

Through the aforementioned experiment, the inventors have reached the idea of the following auxiliary heat-insulating jig according to the present invention.

Figure 5:
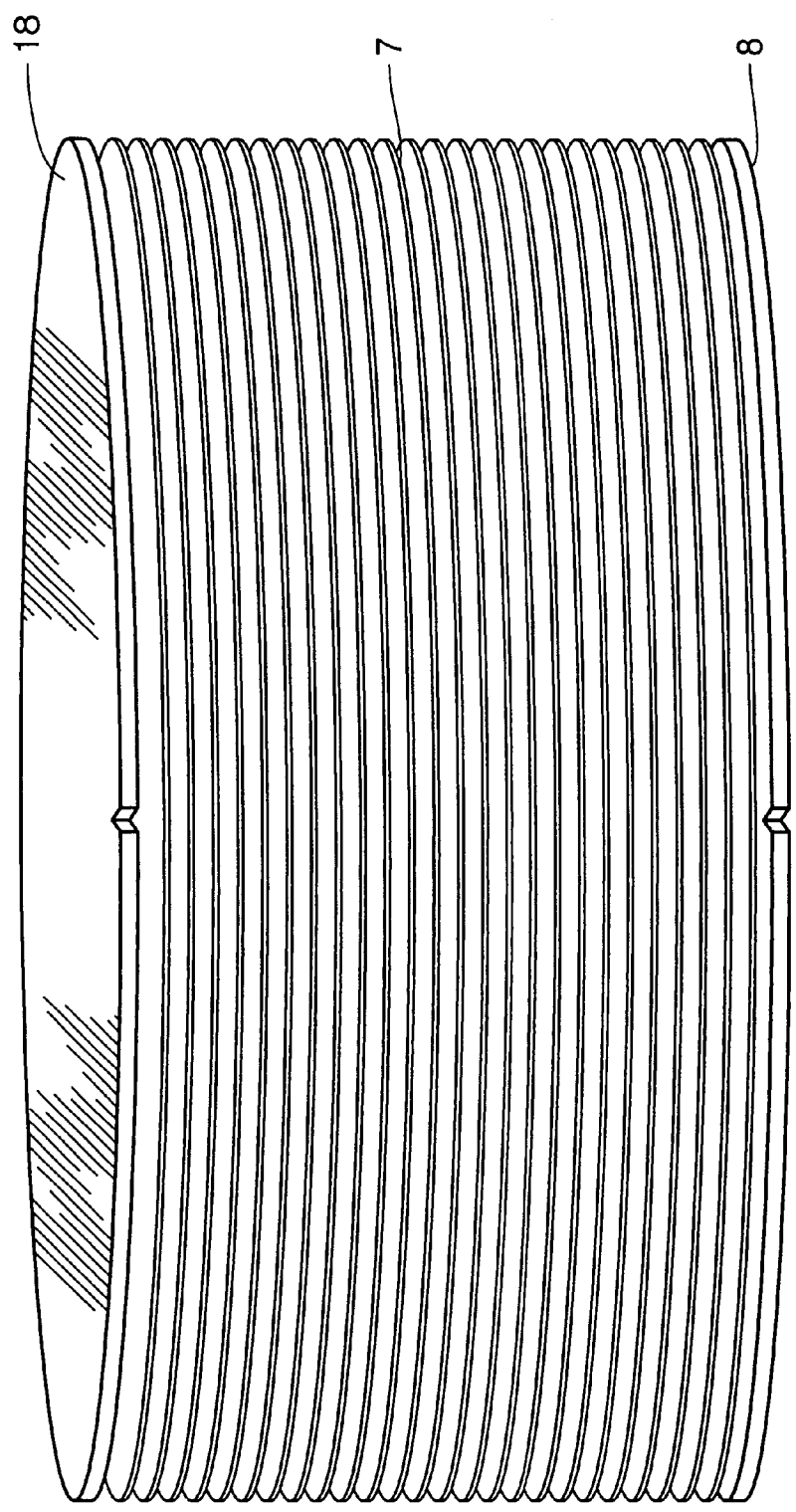
FIG. 5 is a side elevational view of an auxiliary heat-insulating jig according to a first embodiment of the present invention.

FIG. 5 is a perspective view of the auxiliary heat-insulating jig forming the basis of the present invention. This auxiliary heat-insulating jig is manufactured as follows:

First, plate insulators 7 are prepared by a necessary number.

Figure 6:
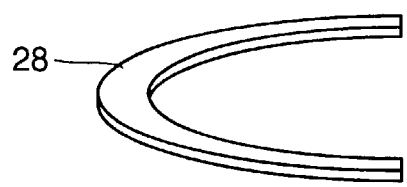
FIG. 6 is a perspective view of a spacer employed for the auxiliary heat-insulating jig.

Then, a necessary number of spacers 28 shown in FIG. 6 are prepared.

Figure 7:
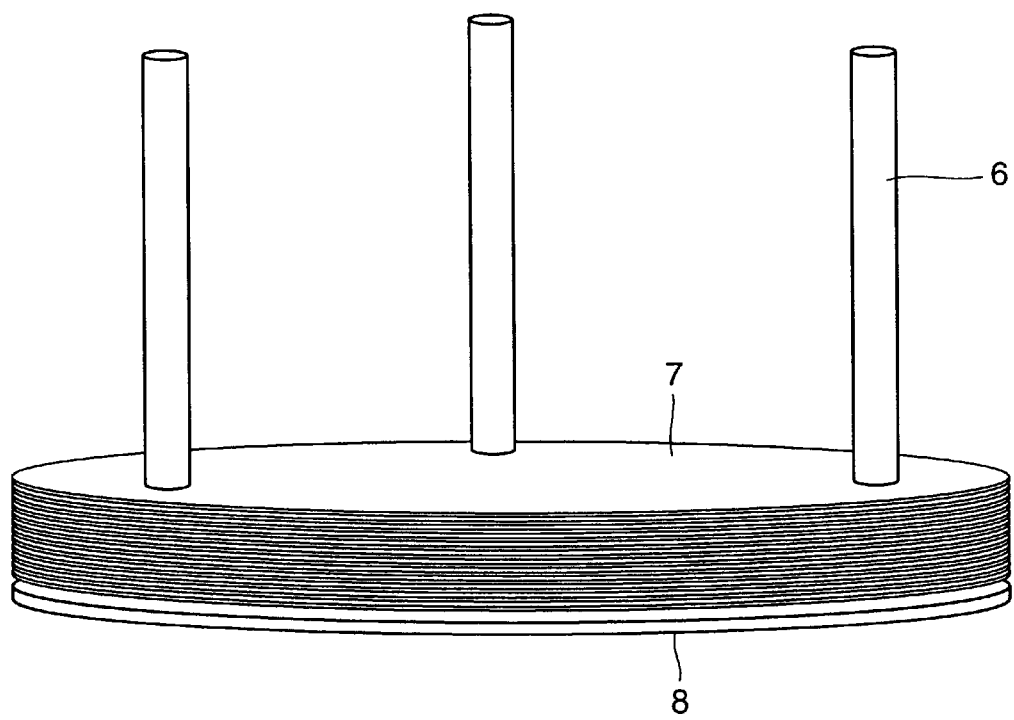
FIGS. 7 and 8 are perspective views of the auxiliary heat-insulating jig according to the first embodiment in intermediate stages of an assembling step.

Then, supports 6 are vertically welded to a bottom plate 8, and thereafter all of the necessary number of plate insulators 7 are engaged with the supports 6 and stacked, as shown in FIG. 7.

Figure 8:
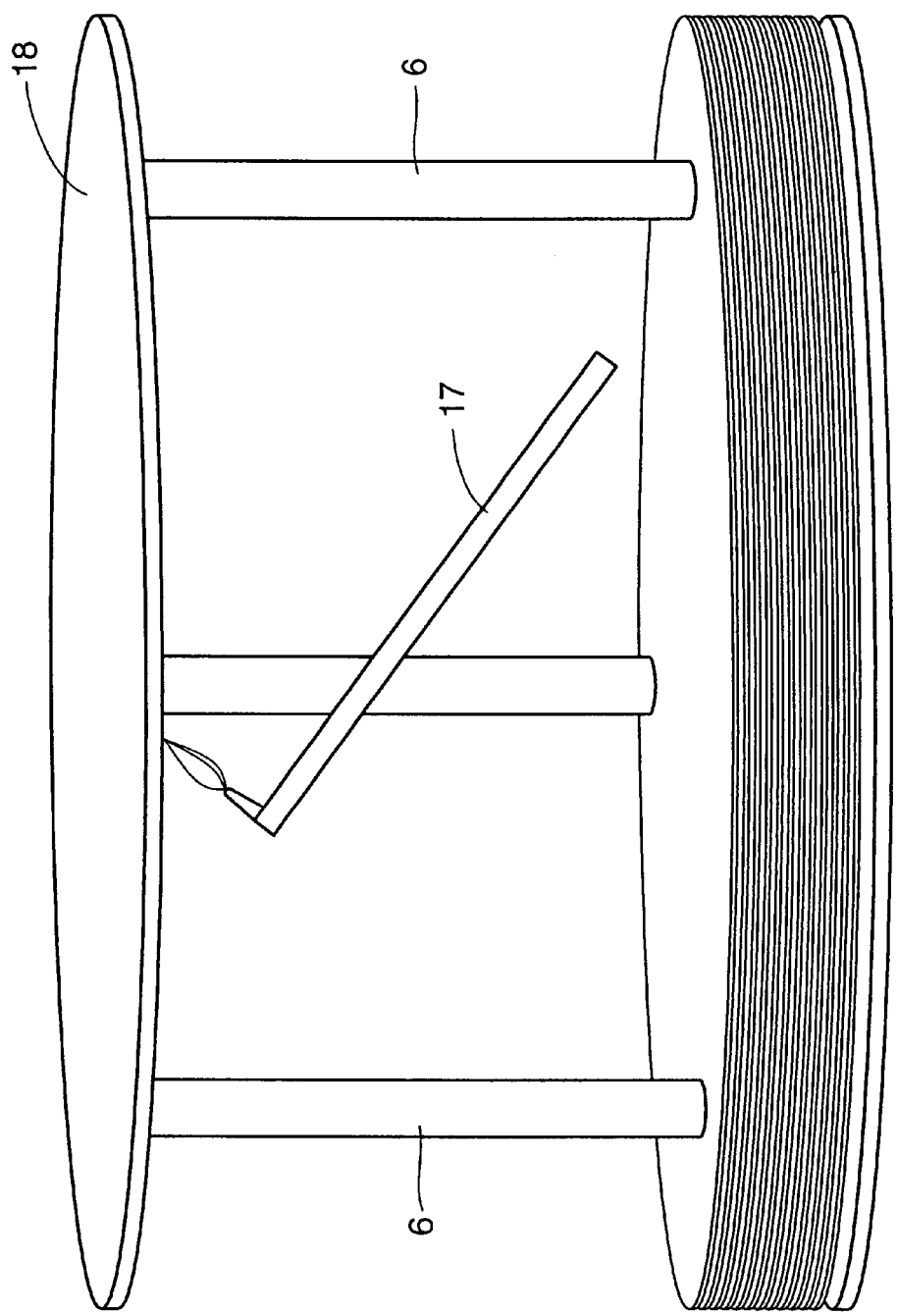

Then, a top plate 8 and the supports 6 are welded to each other with an oxyhydrogen burner 17, as shown in FIG. 8. After the welding, annealing is performed for removing internal strain of quartz glass resulting from the welding.

Referring to FIGS. 5 and 6, the spacers 28 are inserted between the plate insulators 7, for completing the auxiliary heat-insulating jig. At this time, the lower surfaces of the lowermost spacers 13 chamfered (not shown) or tapered (not shown), not to interfere with the welded portions.

While the spacers 28 may be arbitrarily shaped, the positions thereof can be readily fixed when the same are U-shaped or crescent-shaped. Further, the spacers 28, which may be located on arbitrary positions, must be placed on reinforcing parts described below.

The reinforcing parts are now described.

The plate insulators 7 of the auxiliary heat-insulating jig 1 are thermally deformed or reduced in mechanical strength when the same are provided in the form of flat plates similarly to conventional ones.

Figures 9A, 9B:
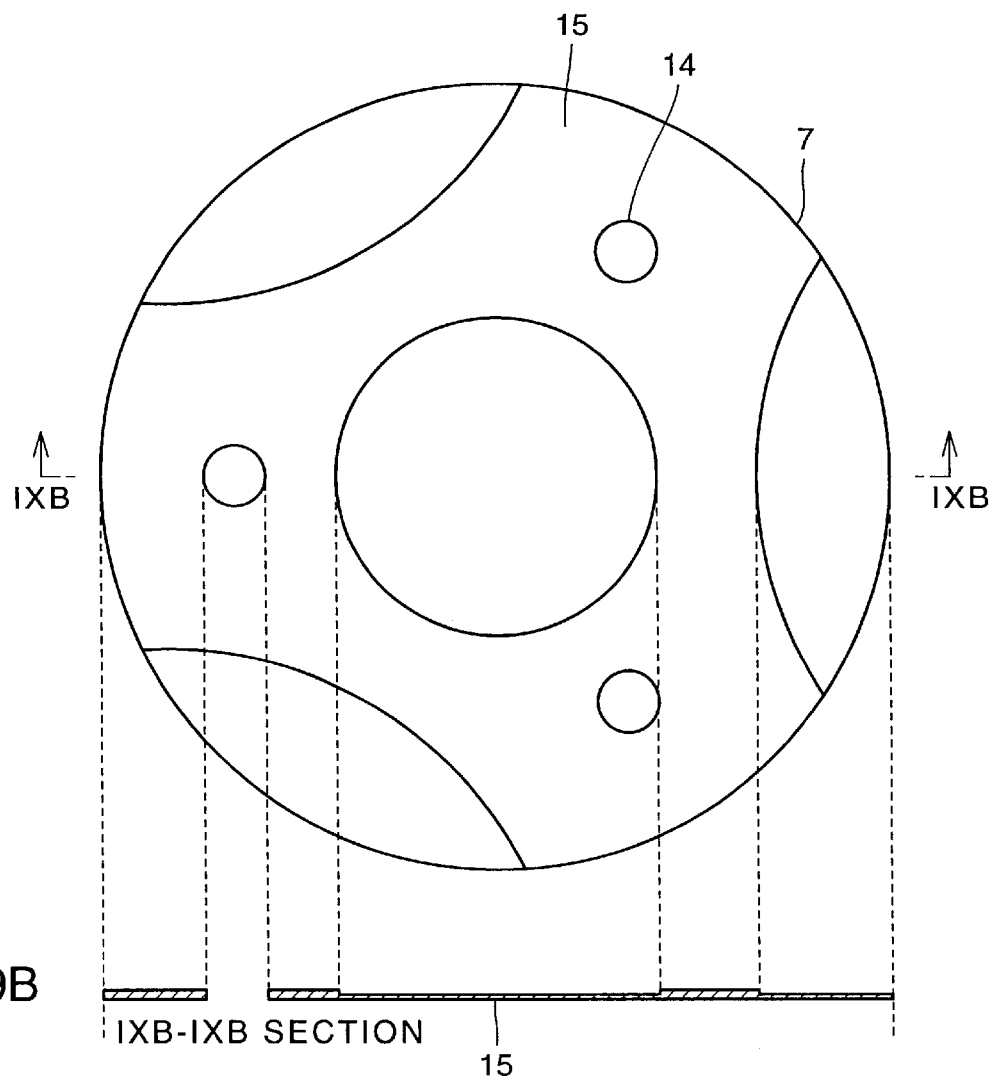
FIG. 9A is a plan view of a plate insulator according to the first embodiment and FIG. 9B is a sectional view taken along the line IXB—IXB.

Therefore, a reinforcing part 15 is radially formed on each plate insulator 7, as shown in FIGS. 9A and 9B. The reinforcing part 15 may be provided to form a circumference apart from the central portion of the plate insulator 7. This reinforcing part 15 is integrally cut out from the same member (opaque quartz glass plate) along with the plate insulator 7. Therefore, the reinforcing part 15, having the same thermal expansion coefficient and the same characteristics against heat as the plate insulator 7, is not warped or separated from the plate insulator 7. The plate insulator 7 can be improved in strength against bending or resistance against thermal deformation by adjusting the angle structure of the reinforcing part 15.

Figure 10:
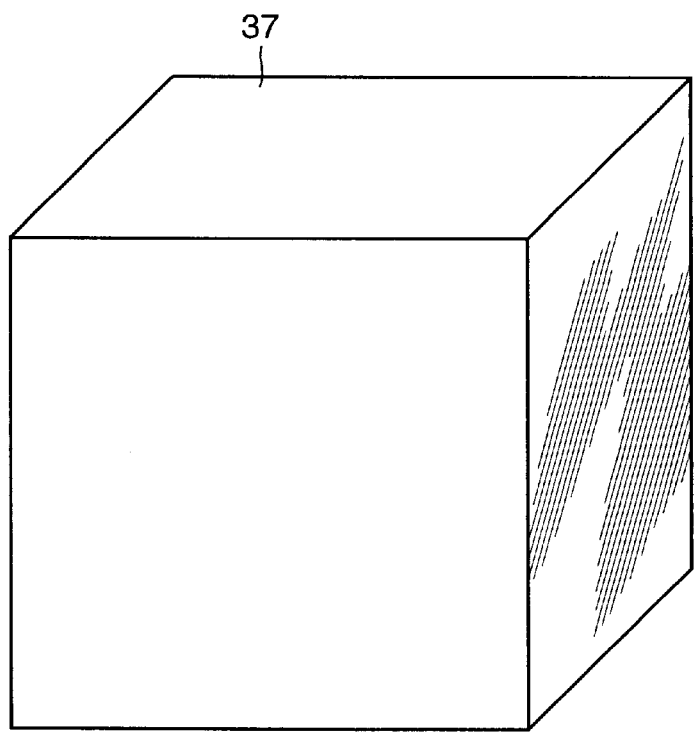
FIG. 10 is a perspective view of a rectangular block of quartz glass.
Figure 11:
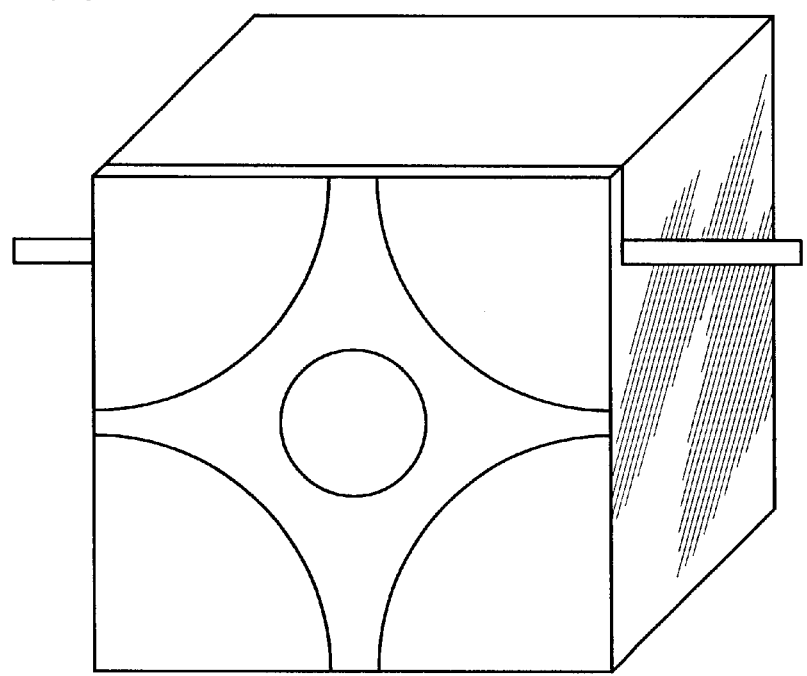
FIG. 11 illustrates the plate insulator cut out from the rectangular block of quartz glass.

Each thin plate insulator 7 is manufactured in the following procedure:

First, a rectangular block 37 of quartz glass is prepared as shown in FIG. 10. The rectangular block 37 of opaque quartz can be obtained from a quartz material maker.

Figure 12:
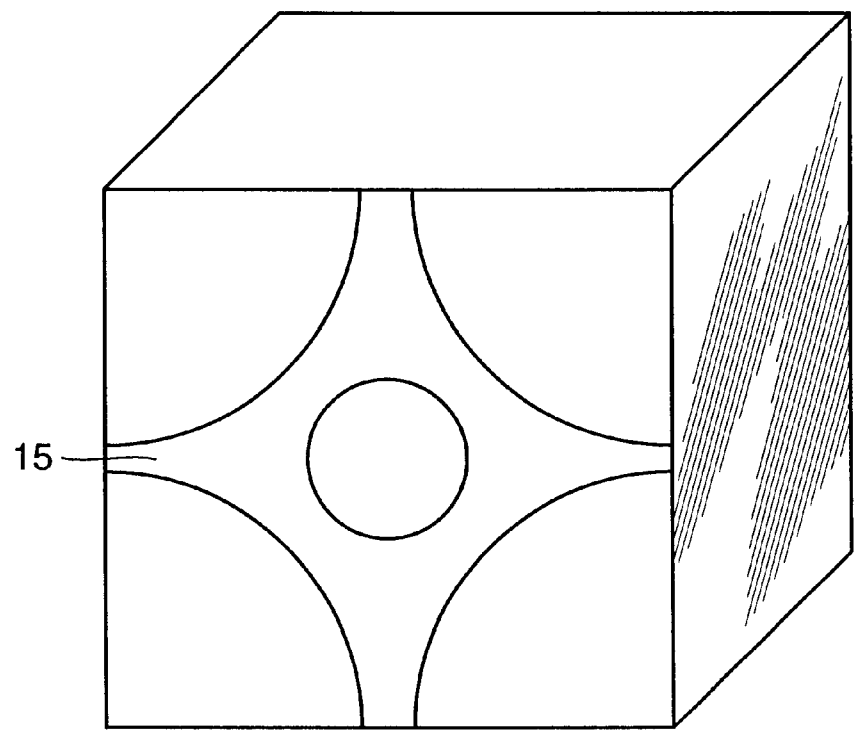
FIG. 12 illustrates the rectangular block of quartz glass worked with a reinforcing part.

Then, a plate is cut out from the rectangular block 37 in a thickness close to a target value. The shape of the reinforcing part 15 is first formed on a surface, as shown in FIG. 12. Then, the plate is cut out and this operation is repeated until a necessary number of plates are cut out. The lower limit of the thickness available for cutting out the plate is 3 mm. If the thickness is not more than 3 mm, the plate is deformed and cannot be satisfactorily cut out from the rectangular block 37.

Figure 13:
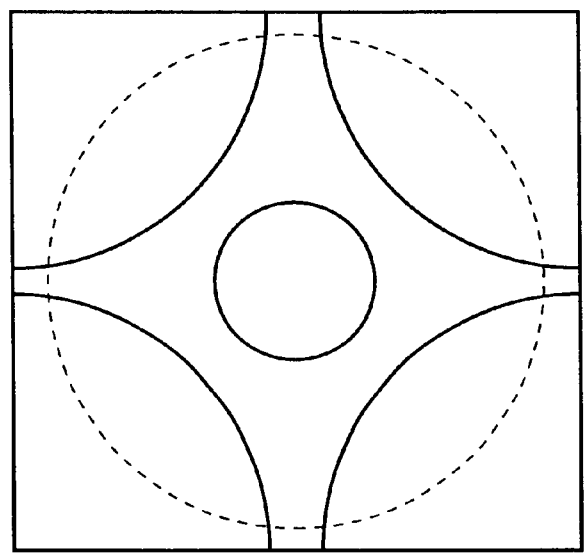
FIG. 13 is a plan view showing the plate insulator cut out from the rectangular block of quartz glass.
Figure 14:
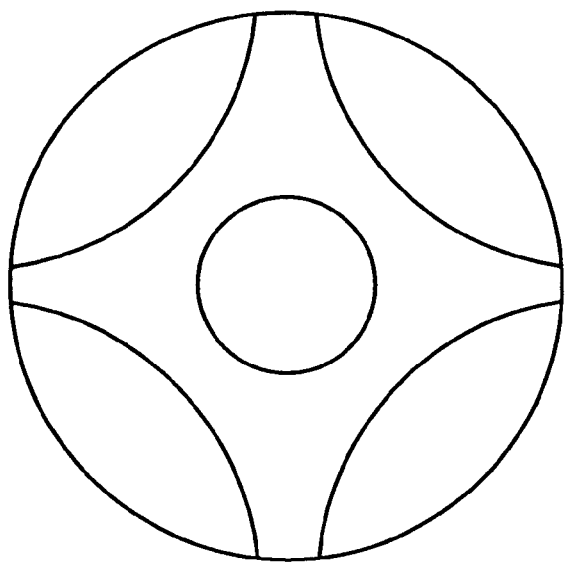
FIG. 14 is a plan view showing the plate insulator not yet polished.

Then, the plate insulator 7 is hollowed out from the plate, as shown in FIGS. 13 and 14. The thickness of the plate insulator 7 is at least 3 mm in this stage.

Figure 15:
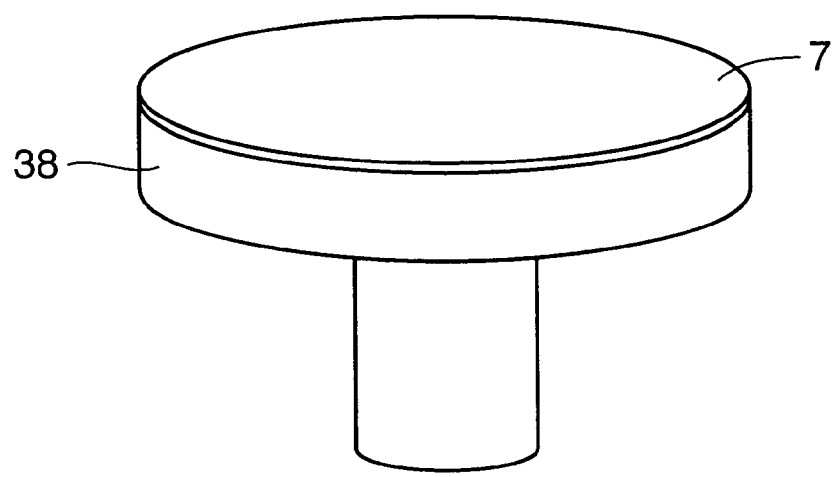
FIG. 15 is a perspective view showing the plate insulator mounted on a quartz glass holding part.

Then, the surface of the plate insulator 7 having the reinforcing part 15 is bonded to a quartz glass holding part 38 of a quartz glass polishing machine with resin, as shown in FIG. 15. The opposite surface of the plate insulator 7 is polished until the thickness of the plate insulator 7 reaches a prescribed value. At present, the plate insulator 7 can be worked up to a thickness of 0.3 mm with precision of $5/100$. The thickness of a silicon wafer having a diameter of 300 mm is 775 $\mu$m, and hence a wafer handling apparatus can be conveniently employed when the thickness of the plate insulator 7 is set to 775 $\mu$m to 1000 $\mu$m in consideration of easiness in handling such as strength.

Referring again to FIG. 5, the thickness of the spacers 28 decides the intervals between the plate insulators 7. Therefore, the plate insulators 7 can be arranged at intervals allowing no welding. In particular, the space between the top plate 18 and the uppermost plate insulator 7 can be reduced. Further, the unwelded plate insulators 7 can be thinly designed as compared with conventional plate insulators designed on the premise of welding. The plate insulators 7 formed by reducing the thicknesses of opaque quartz glass discs have large surface areas, to increase an effect of reflection. Opaque quartz glass having small bubbles therein virtually appears white. When welded, however, the bubbles disappear around welded portions, to render the quartz glass transparent. According to this embodiment, however, the unwelded opaque quartz glass is not rendered transparent.

Second Embodiment

A second embodiment of the present invention relates to a wafer boat 4 provided with plate insulators.

Figure 16:
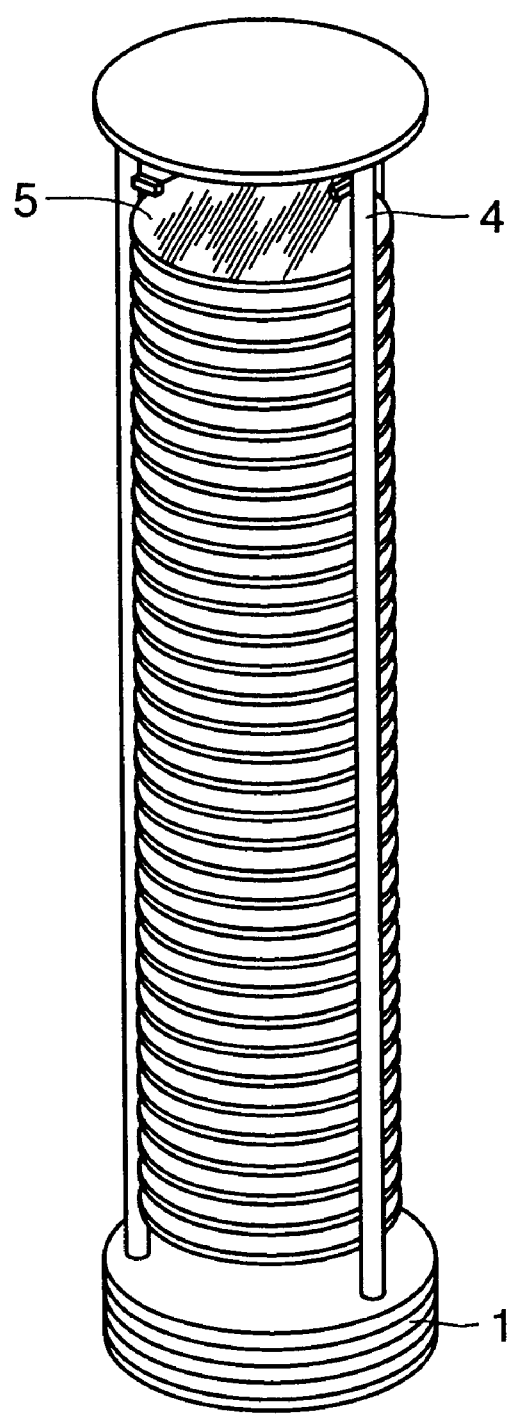
FIG. 16 is a perspective view schematically showing a wafer boat provided with plate insulators according to a second embodiment of the present invention.

FIG. 16 is a perspective view of the wafer boat 4 provided with plate insulators according to the second embodiment. Referring to FIG. 16, an auxiliary heat-insulating jig 1 is integrally mounted on a lower portion of the wafer boat 4.

A method of manufacturing the wafer boat 4 provided with plate insulators is now described.

First, spacers 21 and plate insulators 7 are prepared by necessary numbers, similarly to the first embodiment.

Figure 17:
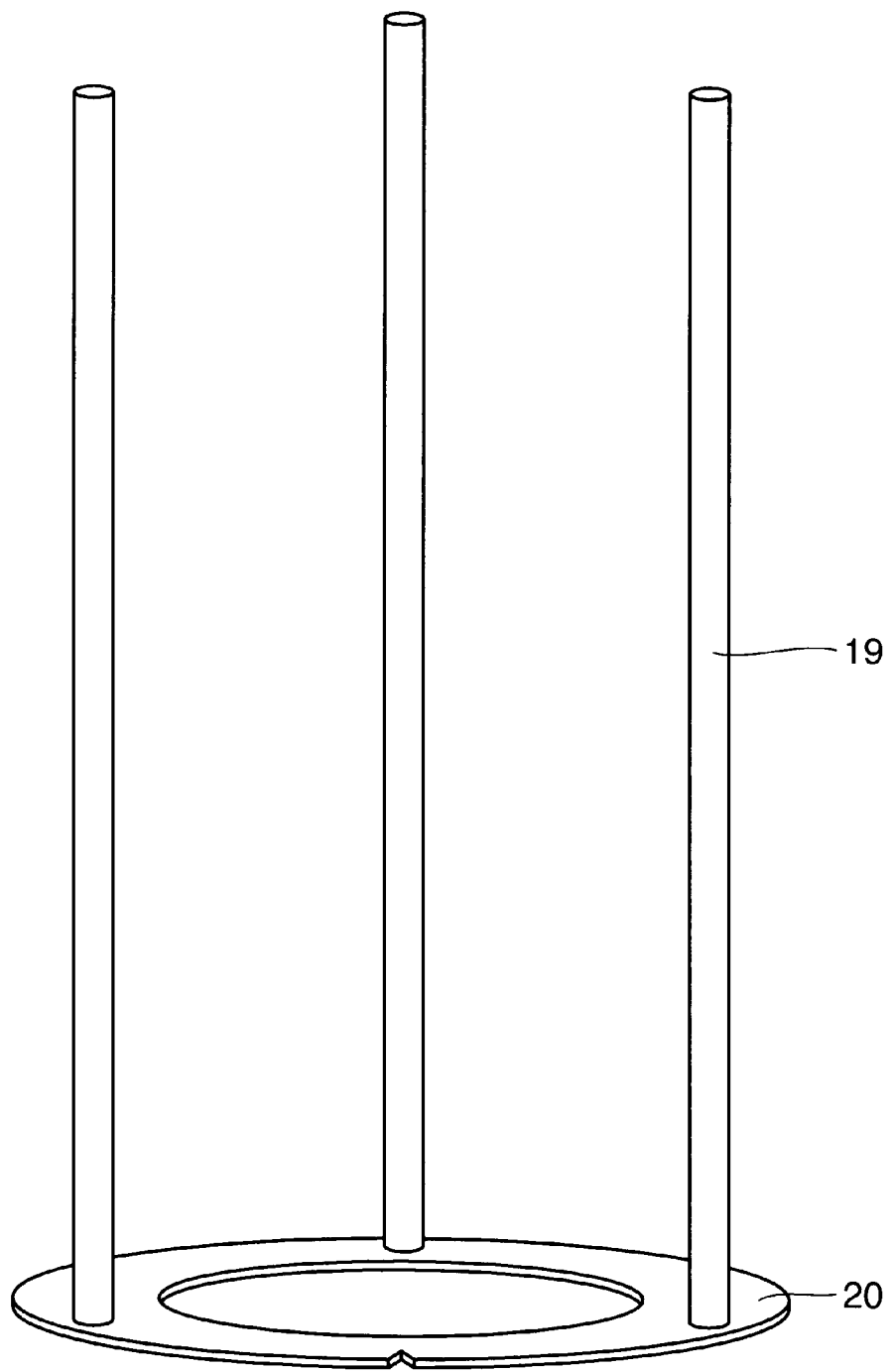
FIGS. 17 to 23 illustrate first to seventh steps in a method of assembling the wafer boat provided with plate insulators according to the second embodiment.

Referring to FIG. 17, three boat supports 19 are vertically set up on a boat bottom plate 20. The boat supports 19 and the boat bottom plate 20 are welded and fixed to each other.

Figure 18:
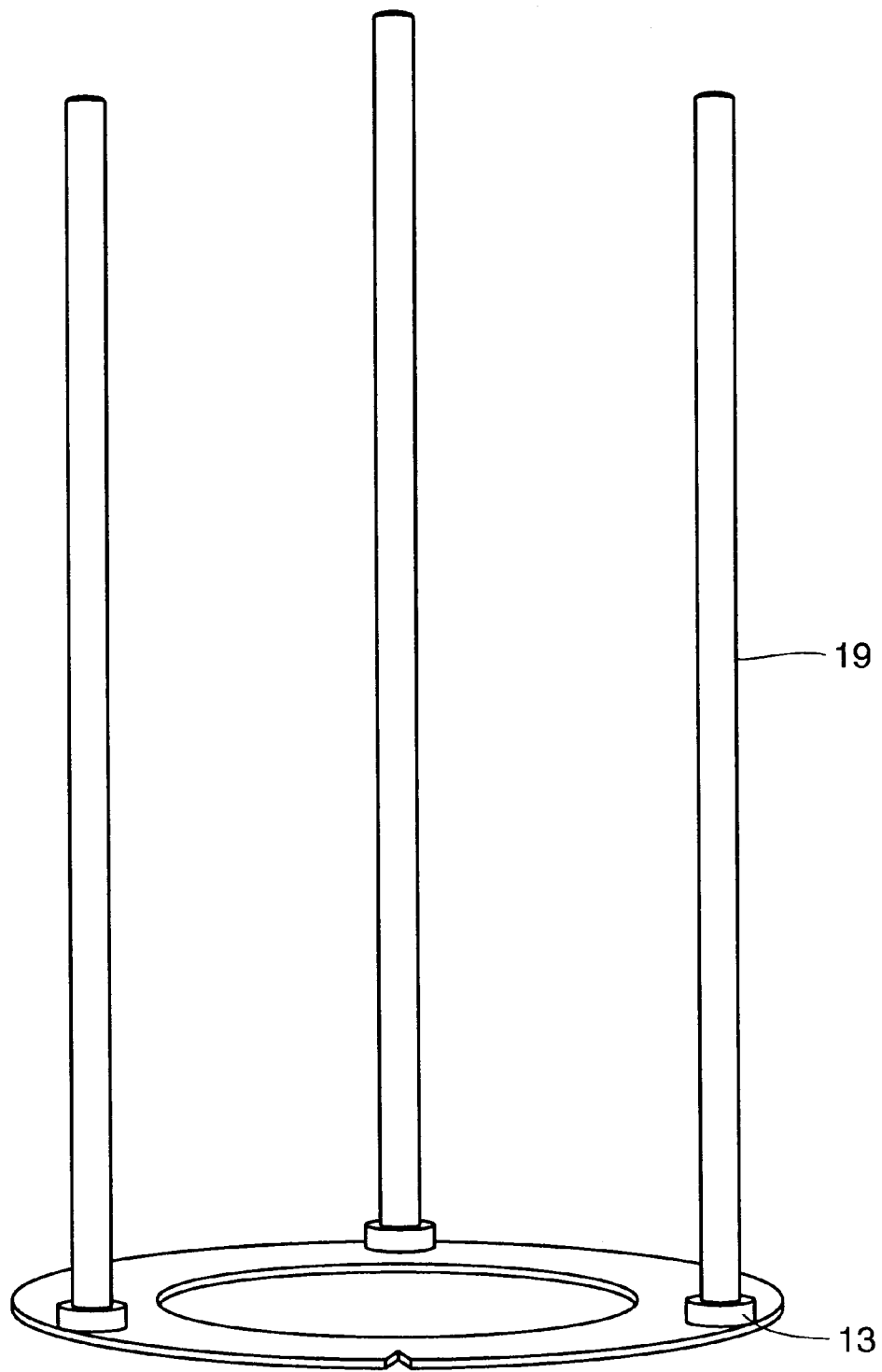

Referring to FIG. 18, lowermost spacers 13 are engaged with the boat supports 19, similarly to the first embodiment.

Figure 19:
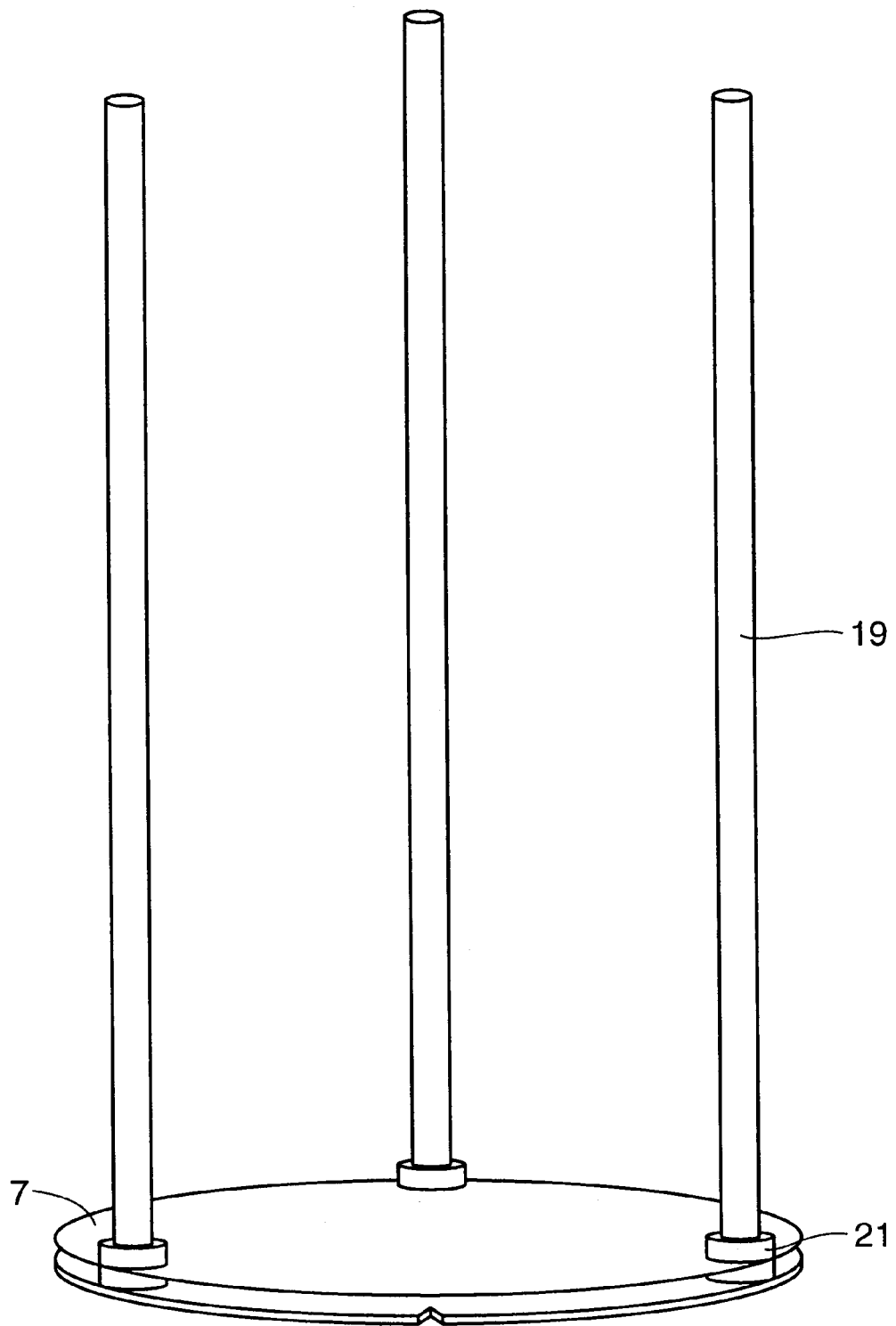

As shown in FIG. 19, the lowermost plate insulator 7 is engaged with the boat supports 19, for receiving the spacers 21 thereon.

Figure 20:
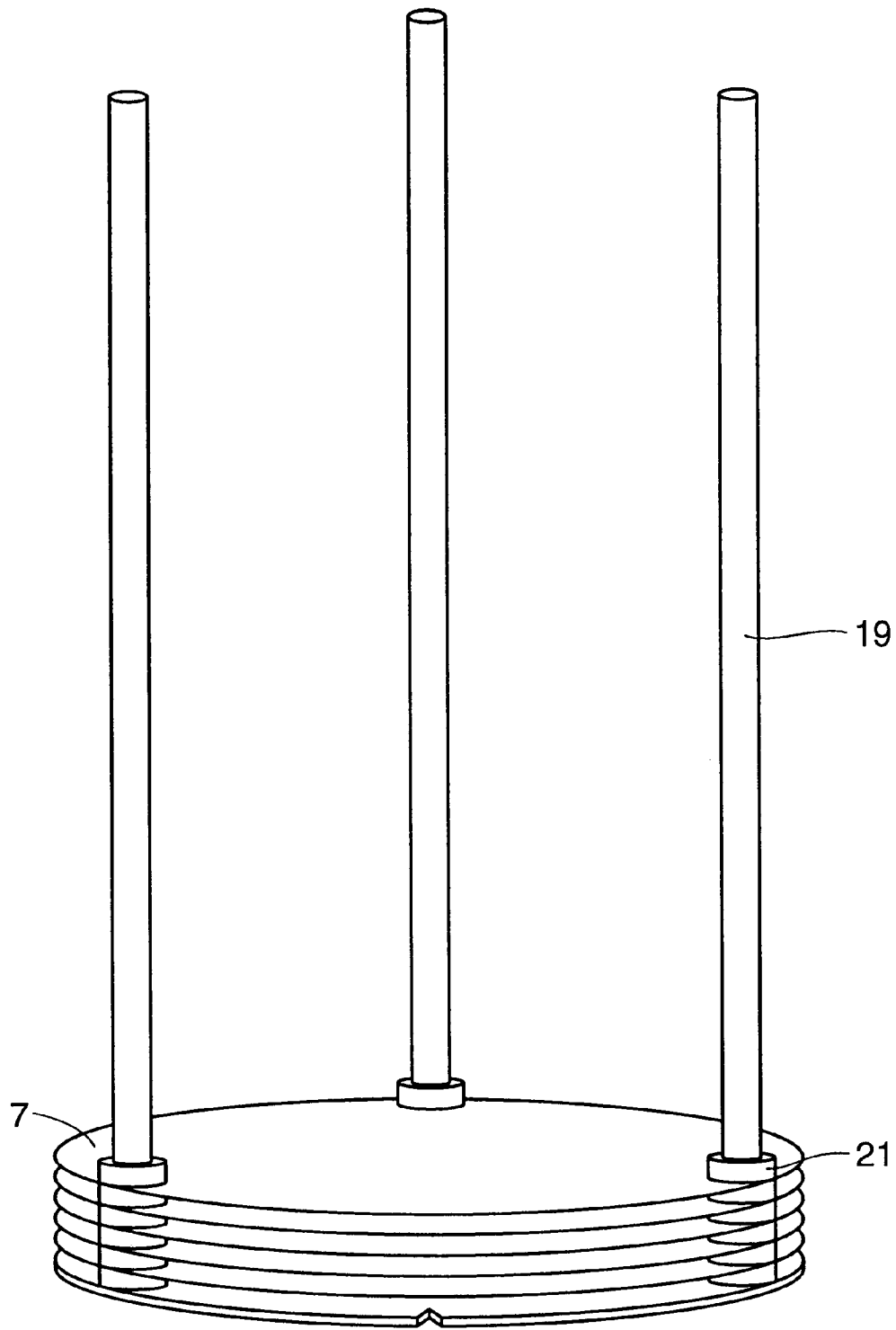

Referring to FIG. 20, the plate insulators 7 and the spacers 21 are alternately engaged with the boat supports 19 by necessary numbers, and boat spacers 21 are set on the uppermost plate insulator 7.

Figure 21:
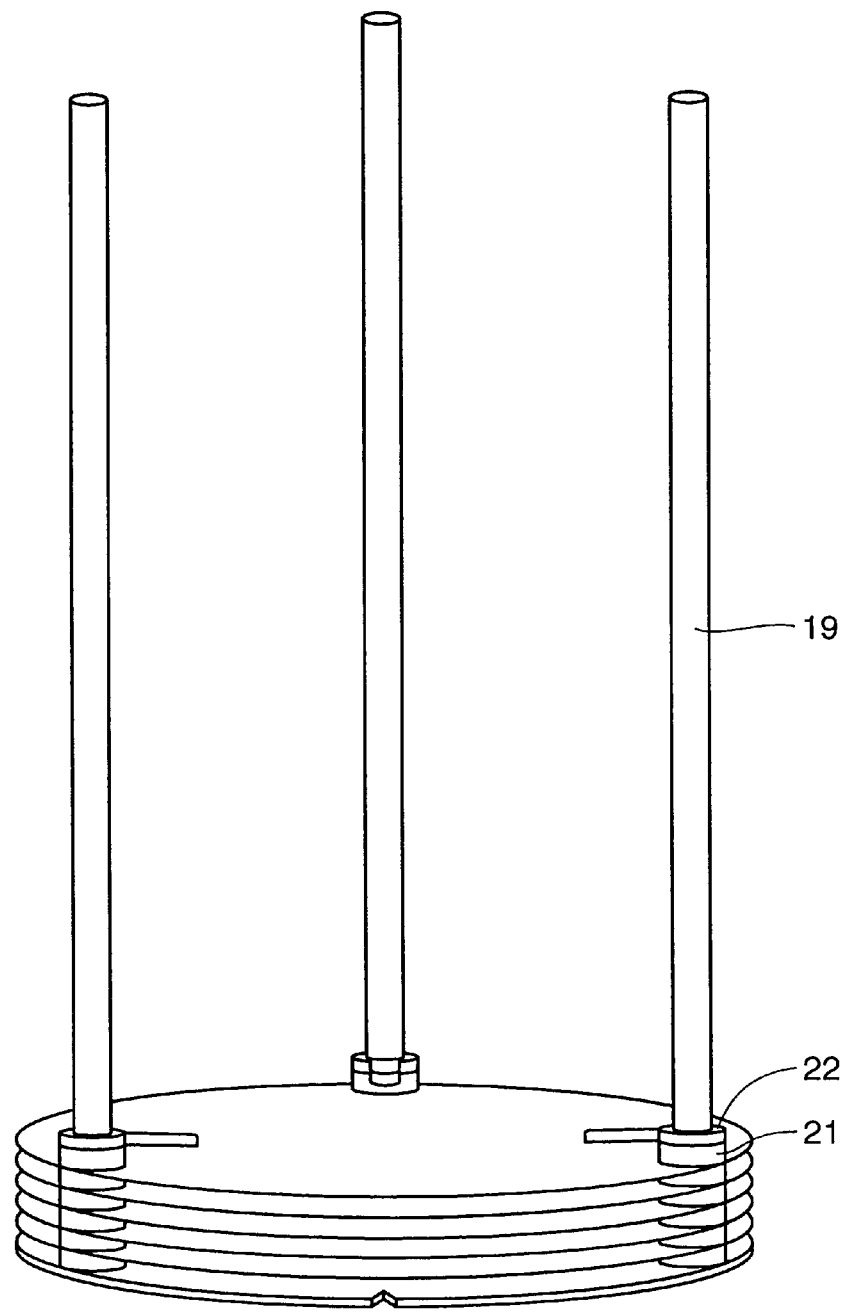

Then, silicon wafer support parts 22 are engaged with the boat supports 19, as shown in FIG. 21.

Figure 22:
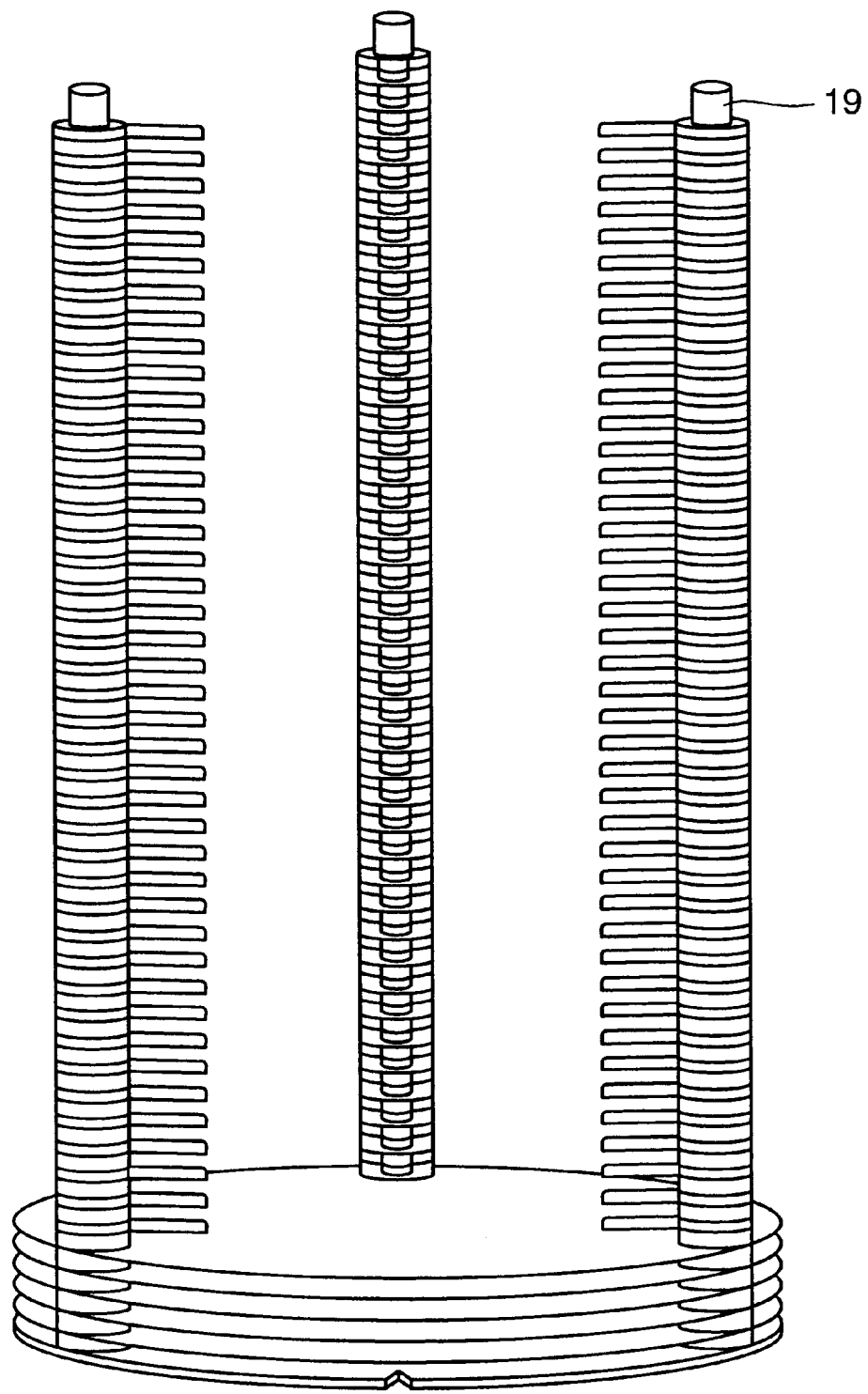
Figure 23:
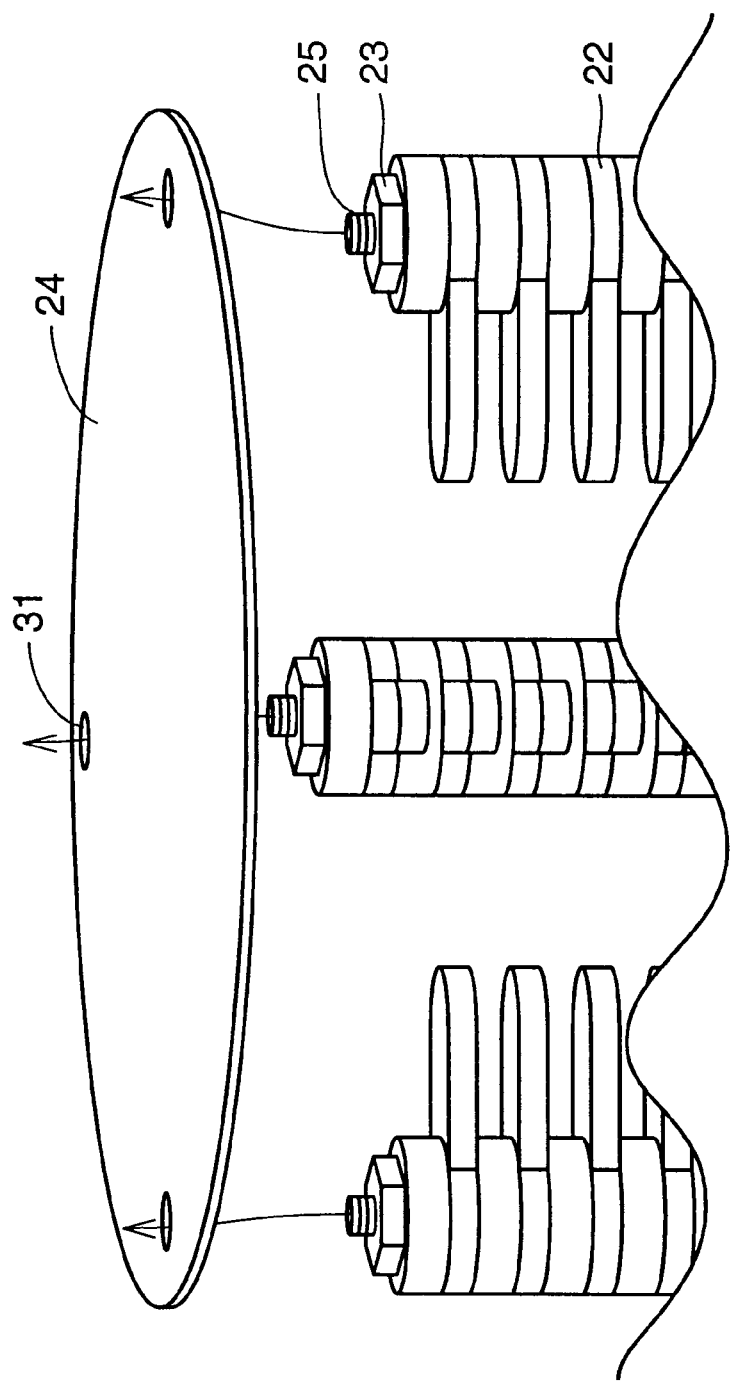

Thereafter the silicon wafer support parts 22 and the boat spacers 21 are alternately engaged with the boat supports 19 by necessary numbers, as shown in FIG. 22.

Finally, uppermost boat spacers 21 are engaged and thereafter the boat supports 19 are fastened with nuts 23 of the same material as that for the wafer boat 4. A boat top plate 24 having holes 31 for receiving the boat supports 19 is set to complete the wafer boat 4.

The nuts 23 may not be employed. In other words, the boat top plate 24 may be pressed downward so that all silicon wafer support parts 22 are horizontal, to be welded to the boat supports 19.

When the boat top plate 24 is not welded, the boat supports 19 are welded to the boat bottom plate 20 and thereafter subjected to annealing for removing strain. When the boat top plate 24 is welded, annealing is finally performed for removing strain.

An effect attained by performing heat treatment with the auxiliary heat-insulating jig 1 according to this embodiment is described. When the thickness of the plate insulators 7 of the auxiliary heat-insulating jig 1 is reduced to 0.775 mm (reinforcing part: 1 mm) identically to a silicon wafer of 30 mm in diameter, for example, increase of thermal capacity caused by mounting a heat-insulating jig on the wafer boat 4 can be reduced. Consequently, heat can be prevented from escaping from a bottom potion without damaging high-speed temperature controllability. Further, the cost for modifying an apparatus to a high-temperature one can be reduced by simply changing the wafer boat as used.

When the boat supports 19 are fixed by the nuts 23, the number of the plate insulators 7 or the intervals between the same can be freely changed at need, usefully for an experiment. When any of the plate insulators 7 is deformed or broken, only the defective plate insulator 7 may be exchanged or improving the maintenance property.

Third Embodiment

A high-speed temperature-control furnace referred to as a mini batch furnace treating a small number of wafers has a short reaction tube, with no space for receiving an auxiliary heat-insulating jig.

A third embodiment of the present invention relates to an auxiliary heat-insulating jig formed by mounting plate insulators in an existing wafer boat.

Figure 24:
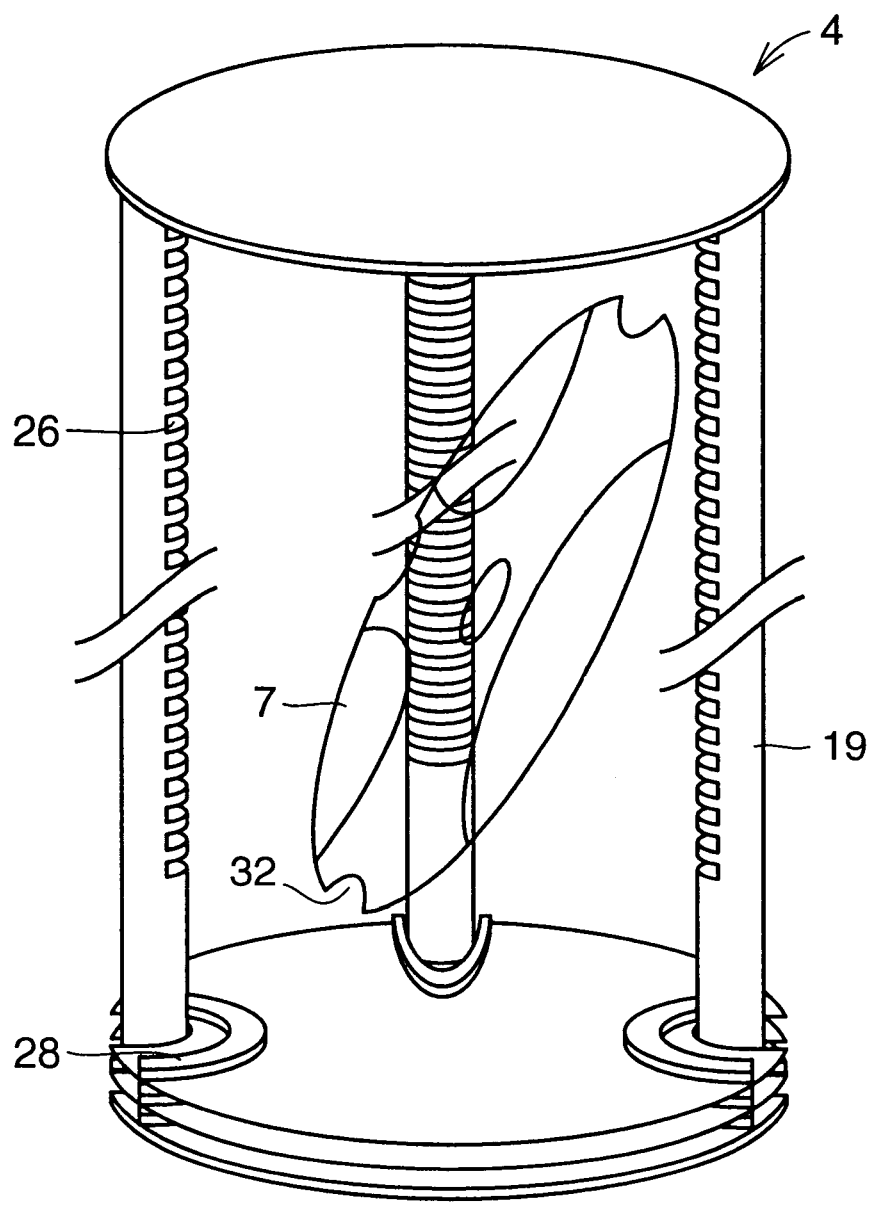
FIG. 24 illustrates a method of assembling a plate insulator into a wafer boat provided with plate insulators according to a third embodiment of the present invention.

FIG. 24 is a perspective view of the auxiliary heat-insulating jig according to the third embodiment. A wafer boat 4 has cylindrical boat supports 19 provided with grooves 26 for supporting wafers. Each plate insulator 7 is provided with U-shaped notches 32 in portions interfering with the boat supports 19. While spacers 28 may be arbitrarily shaped, the positions thereof can be readily ascertained when the spacers 28 are U-shaped or crescent-shaped. The spacers 28 may be placed on any positions so far as the same can be balanced. The spacers 28 and plate insulators 7 are alternately introduced into the wafer boat 4 by necessary numbers for completing the auxiliary heat-insulating jig. Each plate insulator 7 is obliquely forced into the wafer boat 4 through the notches 32, as shown in FIG. 24.

Figure 25:
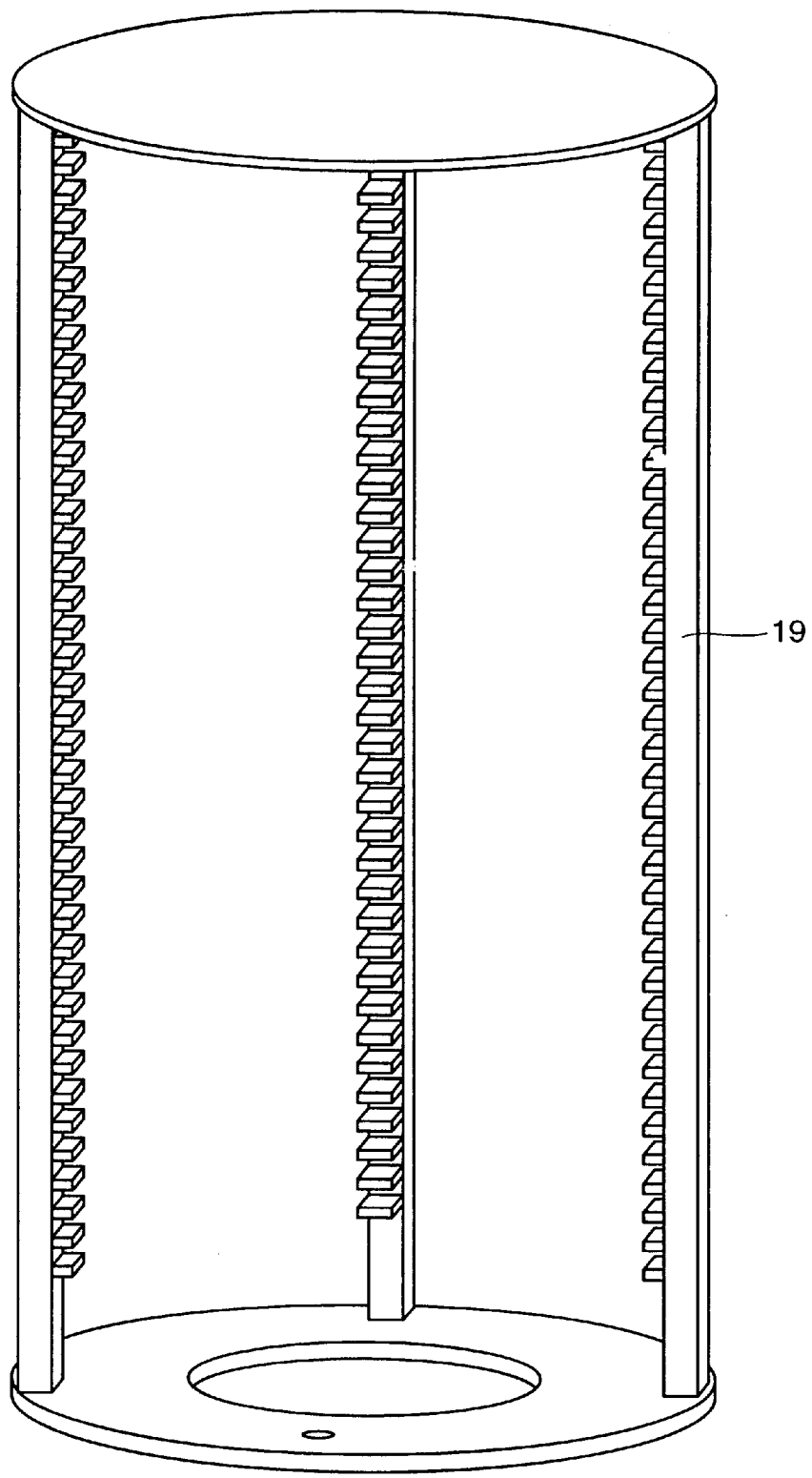
FIG. 25 is a perspective view of a conventional wafer boat to be modified according to the third embodiment.
Figure 26:
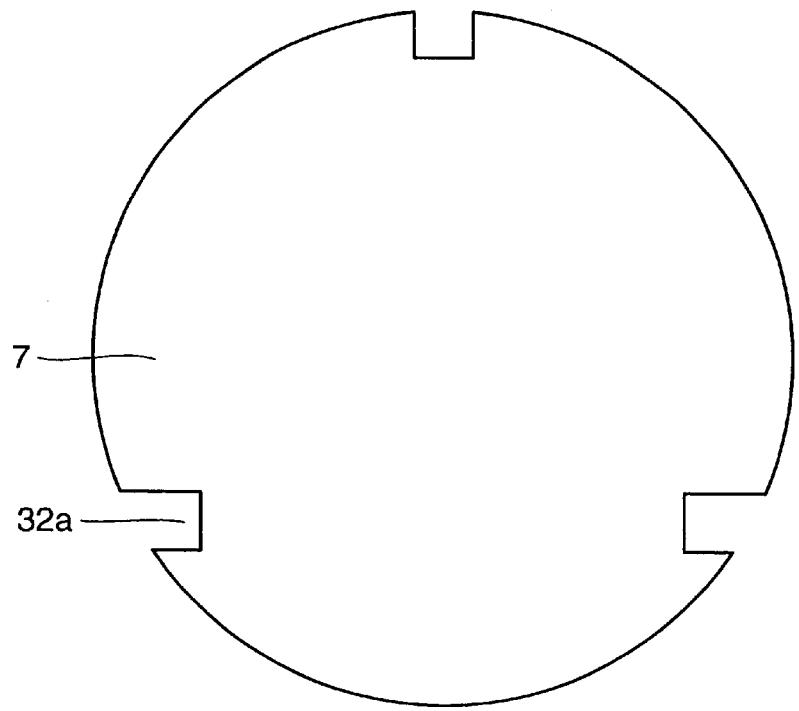
FIG. 26 is a plan view of a plate insulator mounted on the wafer boat.

When prismatic boat supports 19 are employed as shown in FIG. 25, each plate insulator 7 is provided with rectangular notches 32a in corresponding portions, as shown in FIG. 26.

The auxiliary heat-insulating jig according to the third embodiment can attain an effect similar to that of the second embodiment.

Further, the auxiliary heat-insulating jig can be mounted on an existing wafer boat without forming a new wafer boat.

Fourth Embodiment

Figure 27:
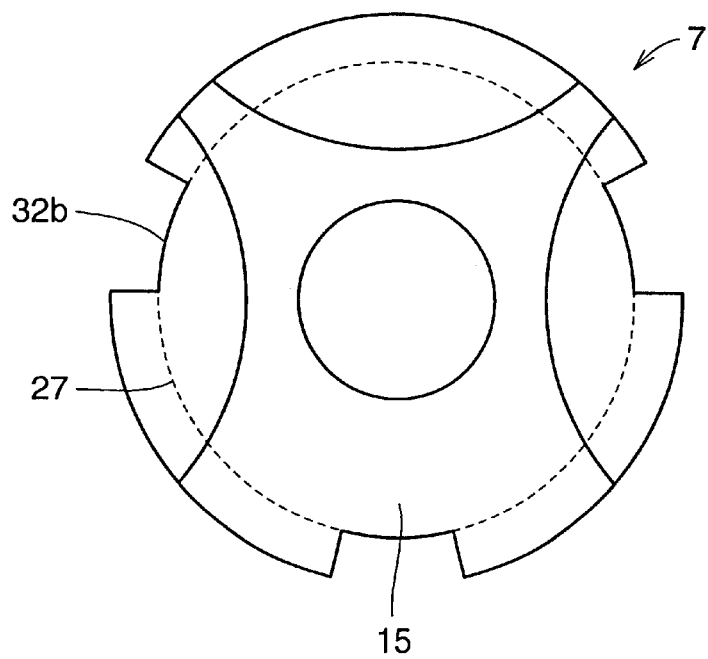
FIG. 27 is a plan view of a plate insulator according to a fourth embodiment of the present invention.
Figure 28:
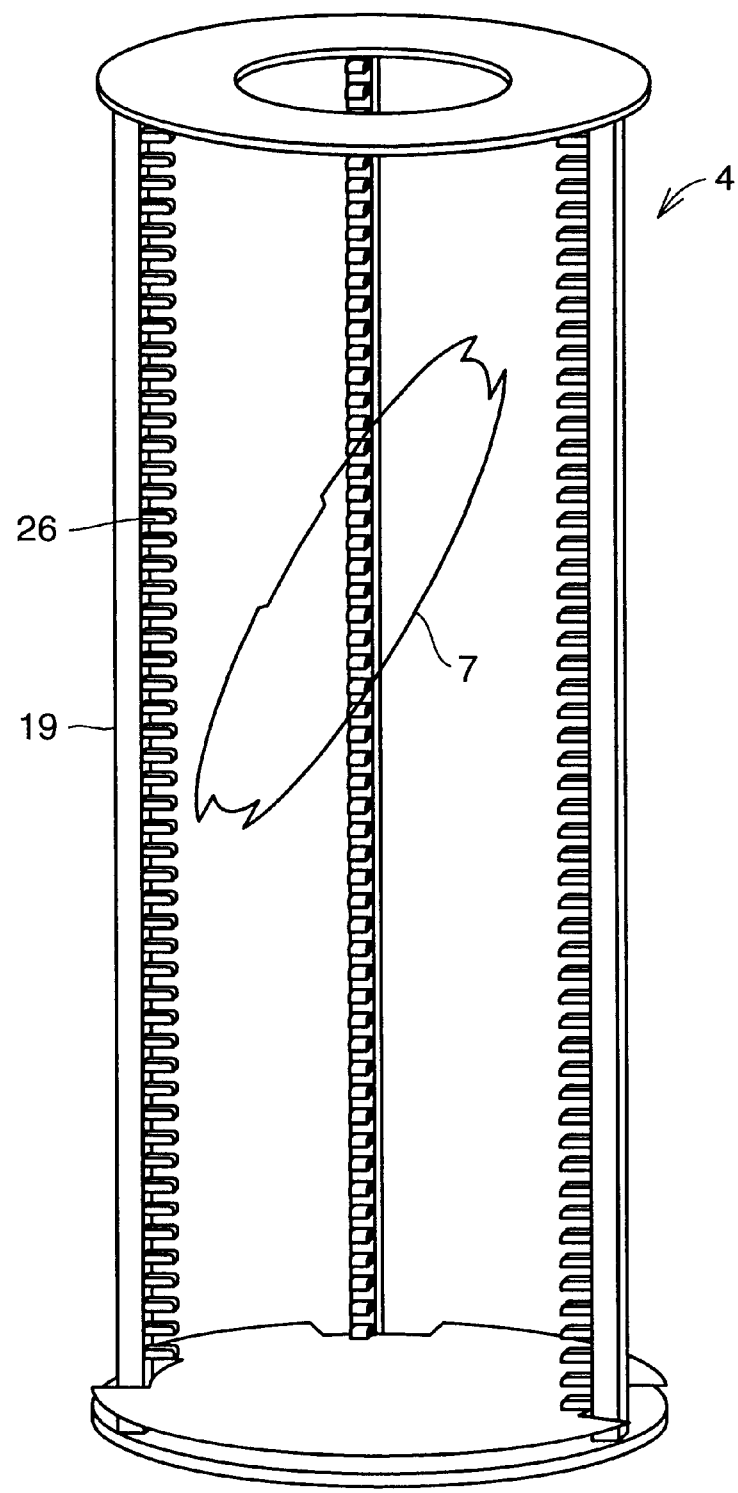
FIG. 28 illustrates the plate insulator according to the fourth embodiment engaged in a wafer boat.
Figure 29:
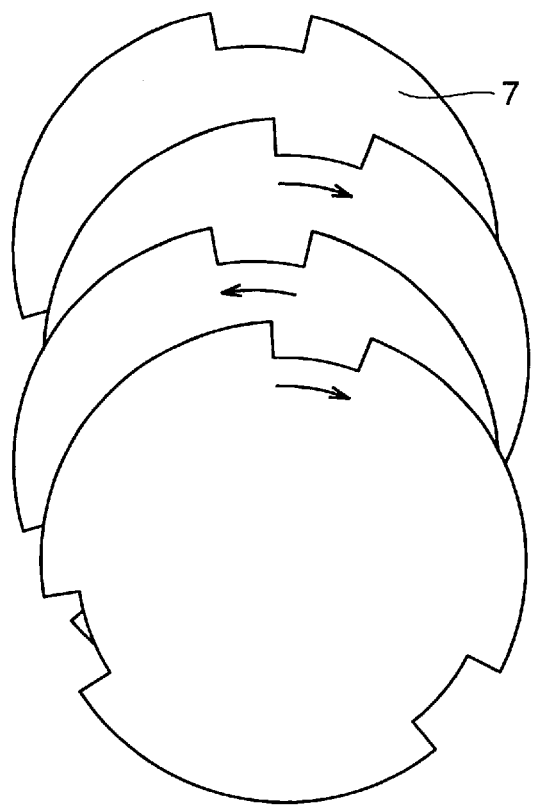
FIG. 29 illustrates a method of setting respective plate insulators according to the fourth embodiment.

FIGS. 27 to 29 are diagrams for illustrating an auxiliary heat-insulating jig according to a fourth embodiment of the present invention.

According to this embodiment, plate insulators 9 are set through grooves 26 formed on a wafer boat 4 for supporting silicon wafers.

When the grooves 26 for supporting wafers are uniformly provided on overall boat supports 19, notches 32b of about twice the width of the boat supports 19 are formed on portions of each plate insulator 7 interfering with the boat supports 19, as shown in FIG. 27. The depth of the notches 32b is set on a circumference 27 shown by a dotted line in FIG. 27. When the circumference 27 is equalized with that of each silicon wafer, each plate insulator 7 can be placed on the grooves 26 of the wafer boat 4.

As shown in FIG. 28, each plate insulator 7 is obliquely inserted and forced into the wafer boat 4. When the notches 32b are sized larger than the boat supports 19, the plate insulator 7 can be readily inserted.

In order to prevent heat radiation from escaping downward from portions close to the boat supports 19, the plate insulators 7 are alternately displaced clockwise and anticlockwise from each other, as shown in FIG. 29.

According to this embodiment, the intervals between the plate insulators 7 are fixed without employing spacers. When no spacers are required, the number of materials can be reduced and the auxiliary heat-insulating jig can be readily set. Further, the plate insulators 7 can be inserted into arbitrary portions of the wafer boat 4.

Fifth Embodiment

FIGS. 30 to 33 are diagrams for illustrating an auxiliary heat-insulating jig 1 according to a fifth embodiment of the present invention.

A method of setting supports 6 of the auxiliary heat-insulating jig 1 on the outer peripheral portion of a bottom plate 8 is similar to that in the second embodiment.

Figure 30A:
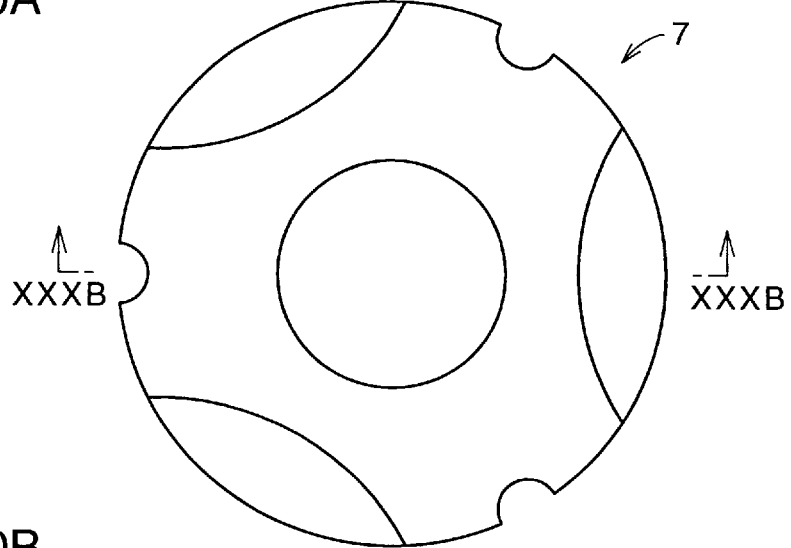
FIG. 30A shows a plan view of a plate insulator employed in a fifth embodiment of the present invention and FIG. 30B shows a sectional view taken along the line XXXB—XXXB.
Figure 30B:
Figure 31:
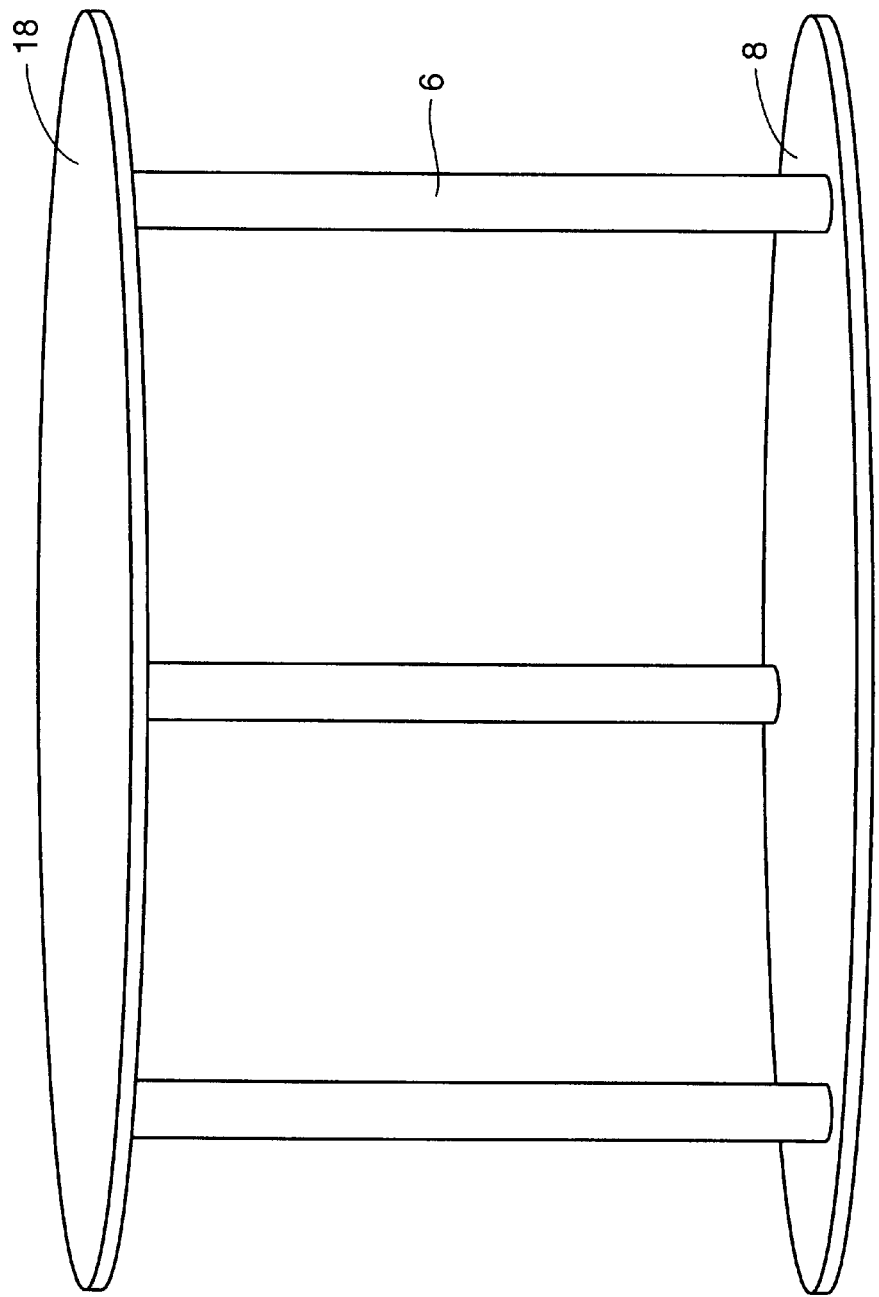
FIGS. 31 to 33 are perspective views showing first to third steps in a method of assembling an auxiliary heat-insulating jig according to the fifth embodiment.

When each plate insulator 7 is prepared as shown in FIGS. 30A and 30B, the auxiliary heat-insulating jig 1 can be manufactured in the following order:

First, the supports 6 are vertically set up on the peripheral portion of the bottom plate 8 and welded to the bottom plate 8, as shown in FIG. 31.

Figure 32:
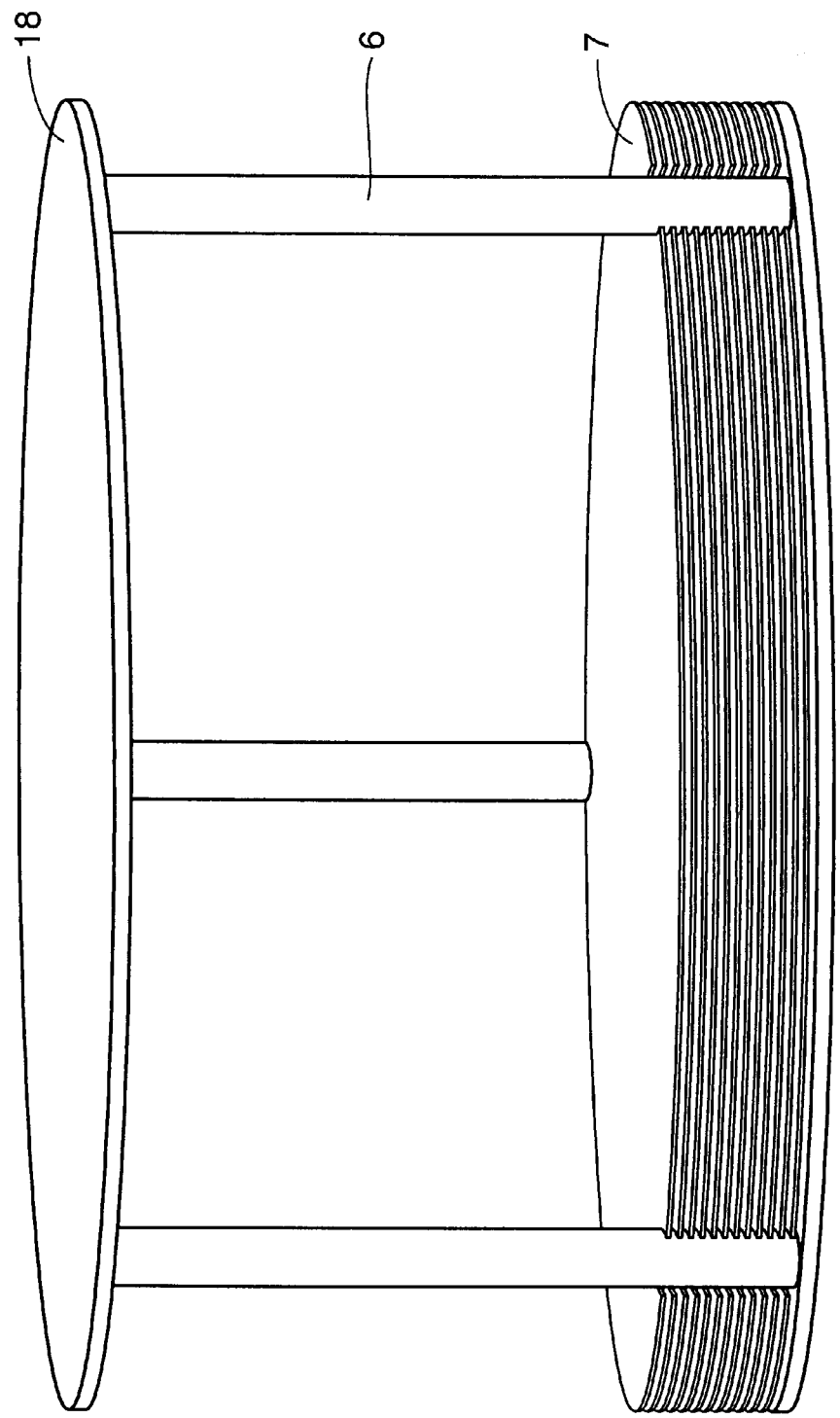

Referring to FIG. 32, a top plate 18 is welded to upper portions of the supports 6 and thereafter annealing is performed for removing internal strain resulting from welding.

Figure 33:
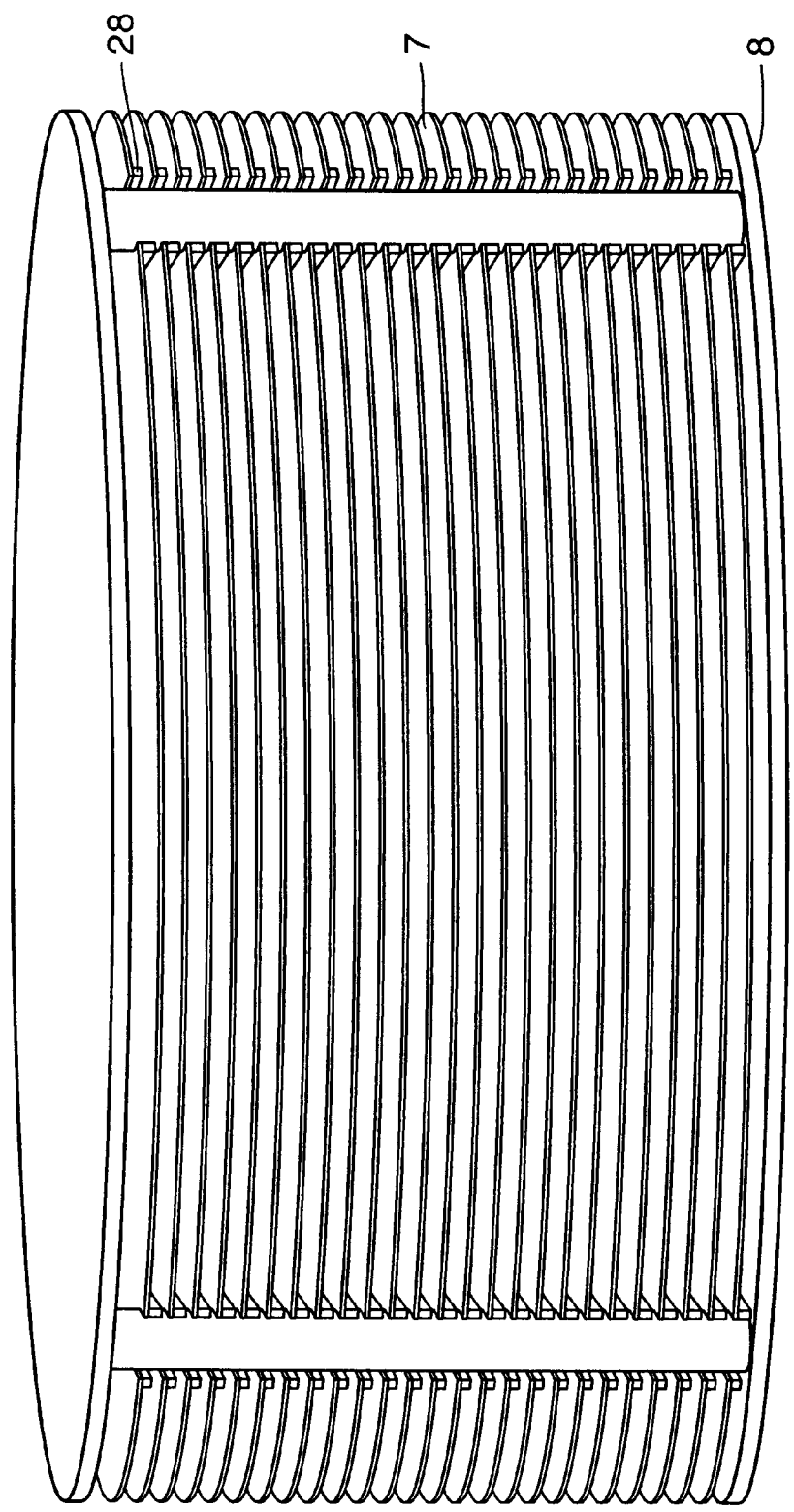

Then, the plate insulators 7 are forced into the frame of the auxiliary heat-insulating jig 1 by a necessary number and superposed with each other, as shown in FIG. 32. Then, the crescent spacers 28 shown in FIG. 6 are inserted between the plate insulators 7, for completing the auxiliary heat-insulating jig 1 as shown in FIG. 33.

According to this embodiment, the auxiliary heat-insulating jig 1 can be formed even if the intervals between the plate insulators 7 are so narrow that no welding is performable. Further, the plate insulators 7 are not yet set when the top plate 18 is welded, whereby the plate insulators 7 may not be erroneously broken.

Sixth Embodiment

When the auxiliary heat-insulating jig or the wafer boat provided with plate insulators according to the present invention is employed, a vertical high-speed temperature-control heat treatment apparatus capable of high-temperature treatment is obtained. The reason why the inventors particularly note high-temperature treatment in a high-speed temperature-control furnace is now described.

Figure 34:
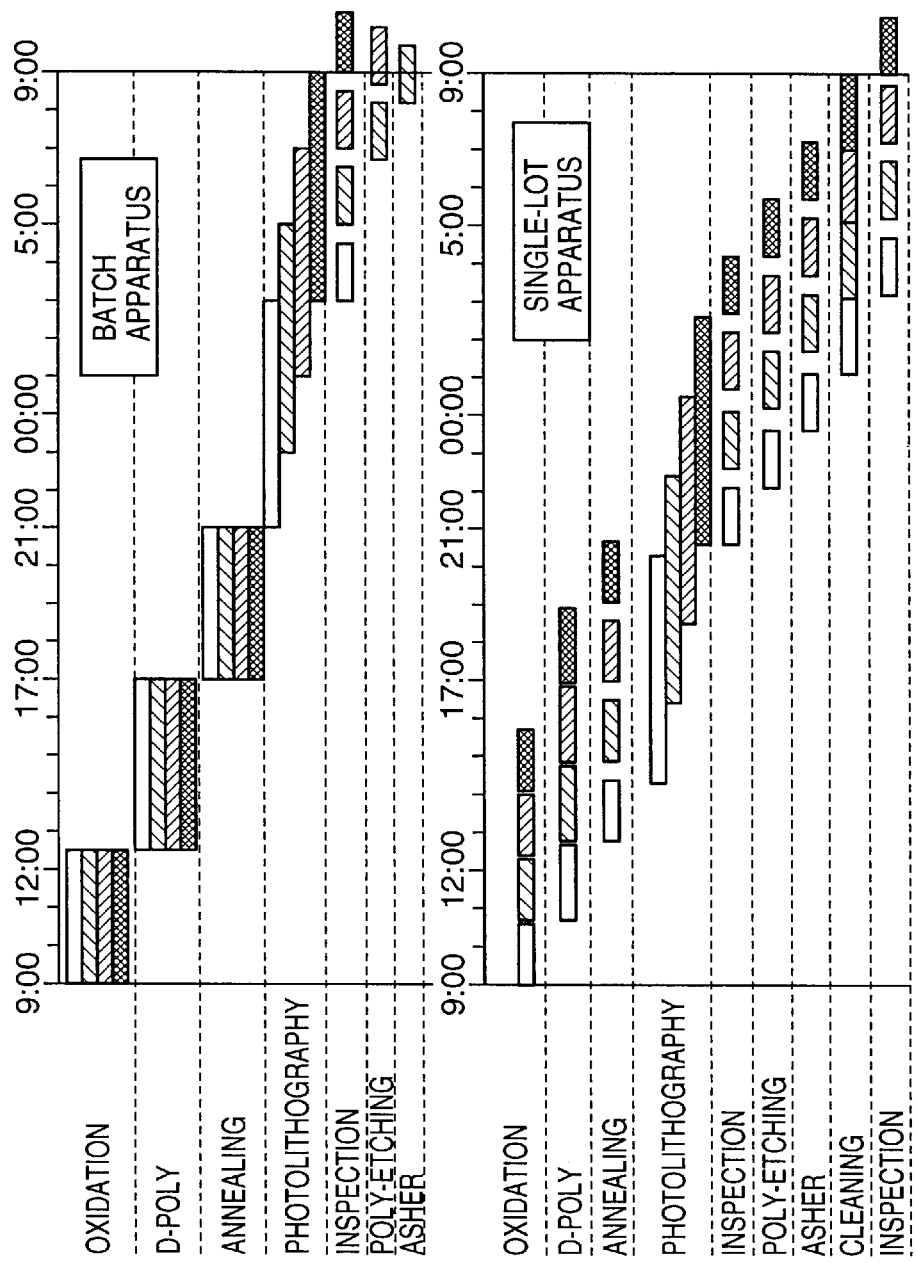
FIG. 34 is a graph comparatively showing the throughputs of a batch apparatus and a single-lot apparatus employed in description of a sixth embodiment of the present invention.

FIG. 34 is a graph comparatively showing the throughputs of a vertical heat treatment apparatus and a high-speed temperature-control vertical heat treatment apparatus.

The treatment time of the vertical heat treatment apparatus requiring a long temperature control time and a long heat treatment time is at least twice that of a single wafer processing apparatus. Therefore, the vertical heat treatment apparatus treating several lots at a time is referred to as a batch treatment apparatus. In the batch treatment apparatus, the time for treating a single lot is identical to that for treating several lots. A high-speed temperature-control heat treatment apparatus capable of reducing the temperature-control time can substantially halve the treatment time.

Referring to FIG. 34, "BATCH APPARATUS" denotes the vertical heat treatment apparatus, and "SINGLE-LOT APPARATUS" denotes the high-speed temperature-control vertical heat treatment apparatus.

The horizontal axis shows 24 hours from 9:00 am on a certain day to 9:00 am on the next day. The vertical axis shows partial steps of fabricating a certain semiconductor device downward from above. "OXIDATION" denotes a step of forming an oxide film carried out in each heat treatment apparatus. "D-POLY" denotes a step of forming a polycrystalline silicon film doped with phosphorus carried out in each heat treatment apparatus. "ANNEALING" denotes a step of activating an impurity carried out in each heat treatment apparatus. "PHOTOLITHOGRAPHY" denotes three steps of resist application, exposure and development carried out in an application apparatus, an exposure apparatus and a development apparatus respectively. "INSPECTION" denotes a step of making an inspection. An electron microscope is employed for confirming a fine structure.

"POLY-ETCHING" denotes a step of etching and working the polycrystalline silicon film doped with phosphorus carried out in an etching apparatus.

"ASHER" denotes a step of removing a resist film carried out in an apparatus referred to as an asher.

"CLEANING" denotes a step of performing cleaning with a chemical carried out in a cleaning apparatus.

The oxidation, D-POLY and annealing steps employing the heat treatment apparatus are noted.

Referring to the graph of FIG. 34, it is assumed that four lots, each formed by 25 silicon wafers, are simultaneously subjected to the oxidation step. Each bar appearing in FIG. 34 shows a single lot, and bars of the same patterns show the same lots. The lengths of the bars show treatment times. The high-speed vertical heat treatment apparatus referred to as "single-lot apparatus" treats a single lot at a time.

As to the first oxidation step, the "batch apparatus" completes treatment of four lots while the "single-lot apparatus" completes treatment of only two lots at 12:30. The vertical heat treatment apparatus is generally known as an apparatus having a high throughput per unit time despite the long treatment time, and this is conceivably a natural result. Even comparison has heretofore been regarded as meaningless. When subsequently tracking the steps, however, the numbers of completely treated lots are mysteriously reversed in the photolithography step. Referring to FIG. 34, the "single-lot apparatus" has an overwhelmingly larger number of bars indicating the number of steps completed in one day.

It has been recognized from the aforementioned consideration that productivity is remarkably improved when a semiconductor fabrication line is formed by single wafer processing apparatuses or apparatuses each treating a single lot at a time. While the point is whether or not all apparatuses can be replaced with single wafer processing apparatuses or apparatuses each treating a single lot at a time, there already exists a single wafer processing apparatus other than the heat treatment apparatus.

A low-pressure CVD apparatus having no heat treatment apparatus can reduce the volume of a reaction chamber when treating a single lot, and hence the times for evacuation and returning to the normal pressure can be reduced. When a high-speed temperature-control heater is employed, the time for temperature recovery can be reduced for enabling treatment of a single lot at a time. A rapid thermal processor (RTP) is already employed for activating an impurity. A thermal oxide film of equivalent quality to that prepared by a vertical heat treatment apparatus is recently obtained through an RTP. A high-speed temperature-control vertical heat treatment furnace can perform oxidation at a temperature of not more than 1000° C.

While a heat treatment step for deeply distributing an impurity in a silicon substrate generally requires such a long time that the step cannot be carried out in an RTP, the impurity can be deeply implanted through a high-energy ion implanter to be activated by the RTP in recent years. A high-energy ion implantation apparatus of a single wafer processing type is present with no problem. A batch-type high-energy ion implanter is also an apparatus treating a single lot at a time.

The finally left problem is annealing for recovering crystal defects. This annealing requires heat treatment under a high temperature over a long time, and hence no RTP can be employed. Even if the RTP is employed, at least one day must be required for completely treating 25 wafers. The treatment temperature of the RTP may be increased for reducing the treatment time. However, in order to remove strain, for example, a wafer of amorphous silica, for example, must be held at 1200° C. (annealing point) for 15 minutes. A longer holding time is conceivably required for a silicon crystal. In order to attain a practical treatment time, the heat treatment time must be below half the holding time. For this purpose, an RTP of a higher temperature must be created. In addition, further study must be made as to the number of heat treatment times enabling defect recovery. Further, an apparatus capable of coping with a temperature exceeding 1200° C. itself must be developed as to that corresponding to a silicon wafer of at least 300 mm in diameter.

According to a sixth embodiment of the present invention, therefore, the inventive auxiliary heat-insulating jig 1 is combined with the heat-insulating jig 2, as shown in FIG. 1. Thus, a furnace capable of recovering crystal defects can be obtained by modifying a currently present high-speed temperature-control vertical heat treatment furnace to a high-temperature heat treatment apparatus.

Thus, all semiconductor device fabrication apparatuses of a semiconductor fabrication line can be formed by single wafer processing apparatuses or apparatuses each treating a single lot at a time due to the high-speed temperature-control vertical heat treatment apparatus of a high-temperature specification.

The high-speed temperature-control vertical heat treatment apparatus according to the present invention can be employed for a high-temperature annealing step, whereby a semiconductor device fabrication line improved in fabrication balance as well as productivity can be constructed.

Figure 35:
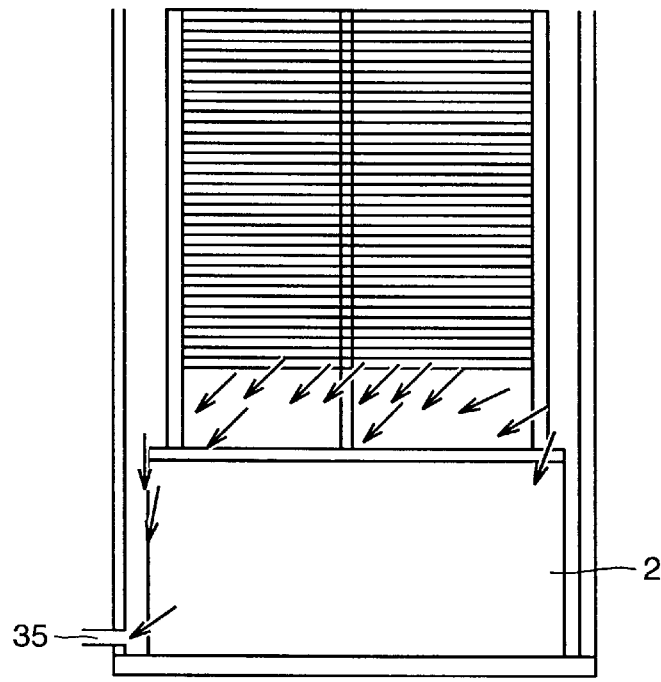
FIG. 35 illustrates flows of gas around a conventional heat-insulating jig during heat treatment.
Figure 36:
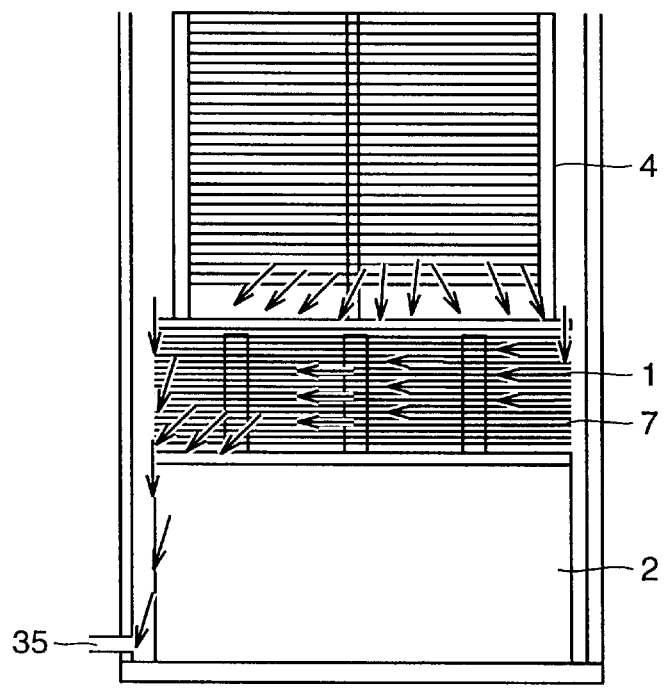
FIG. 36 illustrates flows of gas around a heat-insulating jig, employing the auxiliary heat-insulating jig according to the present invention, during heat treatment.
Figure 37:
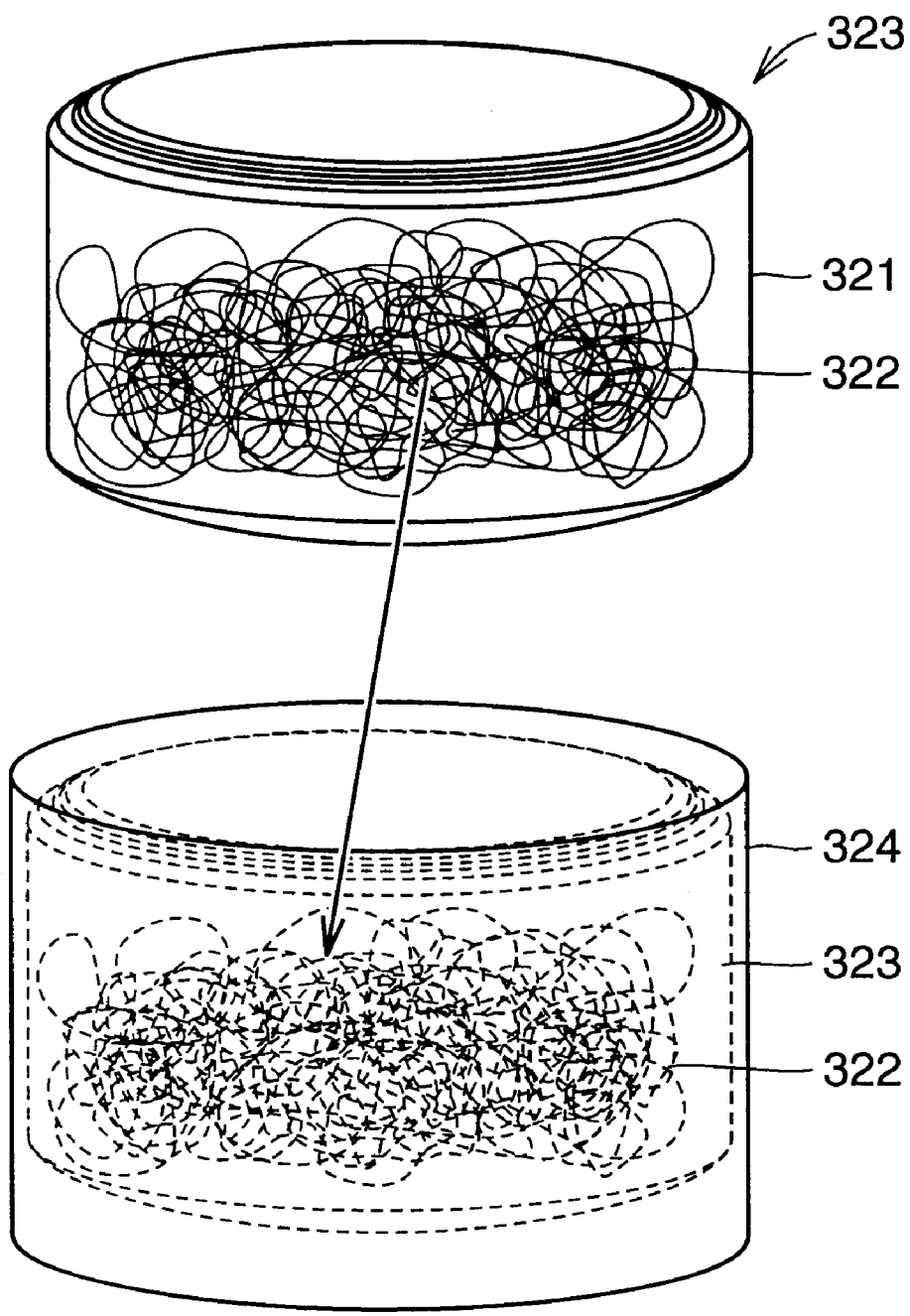
FIG. 37 is a perspective view schematically showing a conventional heat-insulating jig.
Figure 38:
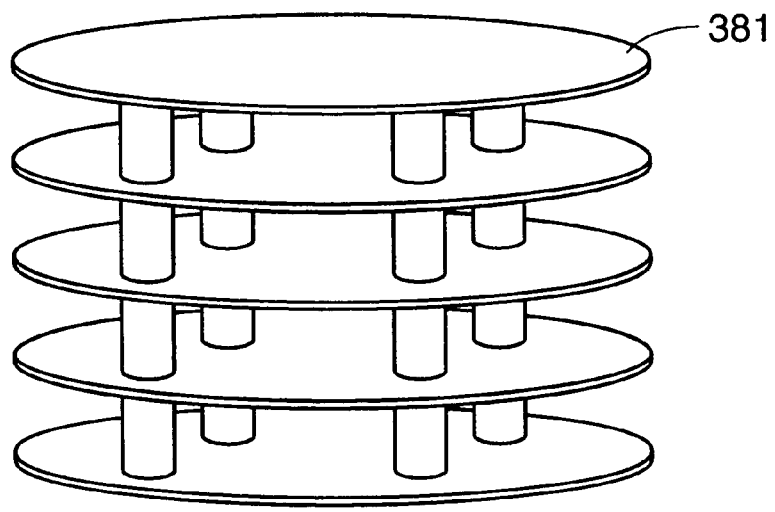
FIG. 38 is a perspective view schematically showing another conventional heat-insulating jig.
Figure 39:
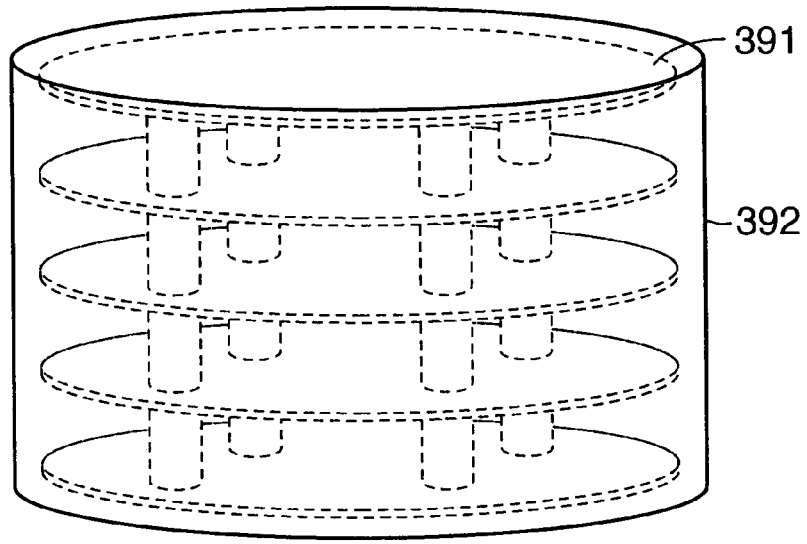
FIG. 39 is a perspective view schematically showing still another conventional heat-insulating jig.
Figure 40:
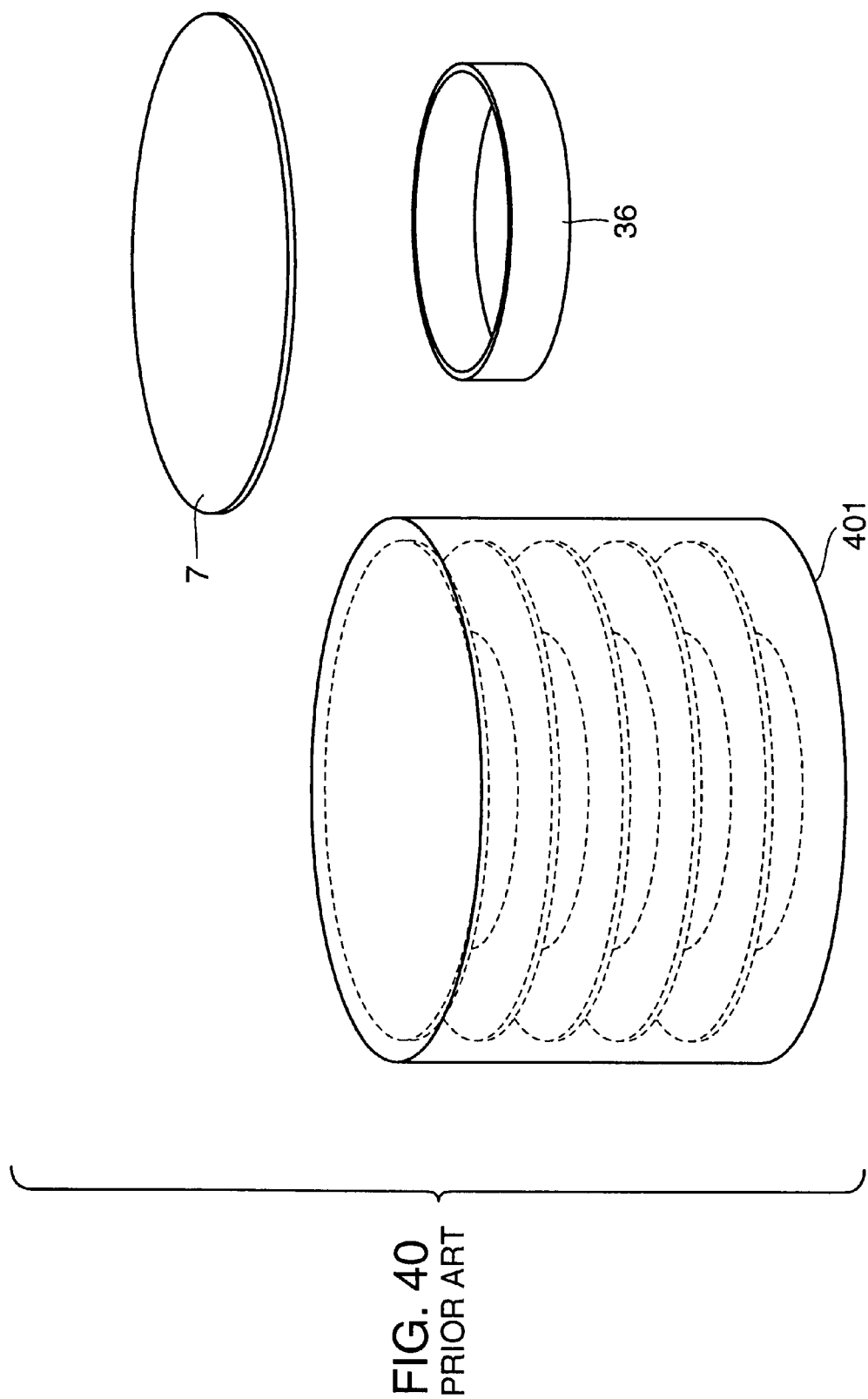
FIG. 40 is a perspective view schematically showing a further conventional heat-insulating jig.
Figure 41:
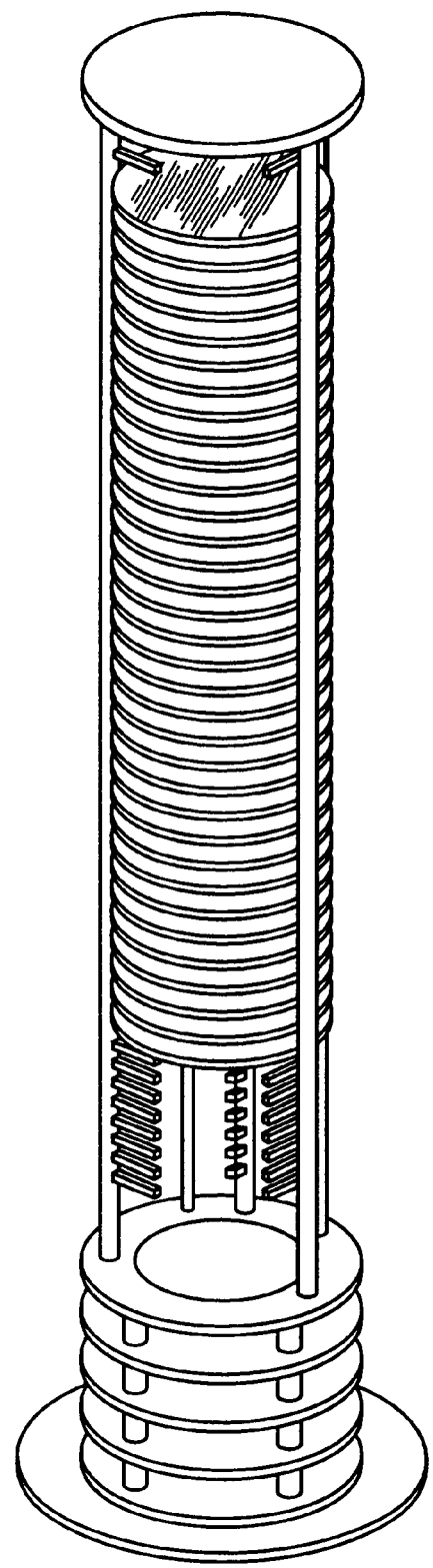
FIG. 41 illustrates a wafer boat placed on a further conventional heat-insulating jig for low temperatures.
Figure 42:
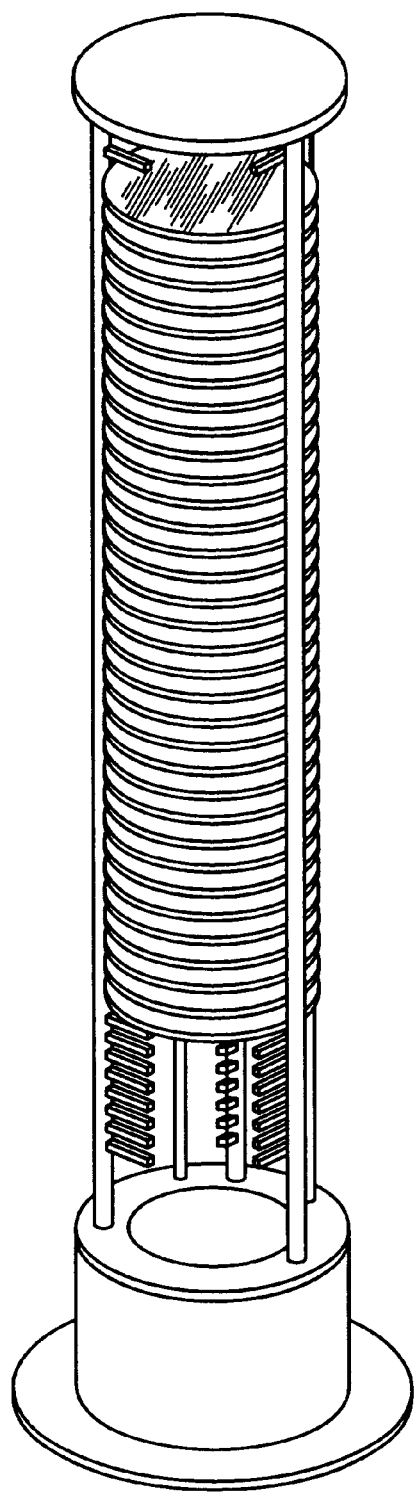
FIG. 42 illustrates a wafer boat placed on a further conventional heat-insulating jig for high temperatures.
Figure 43:
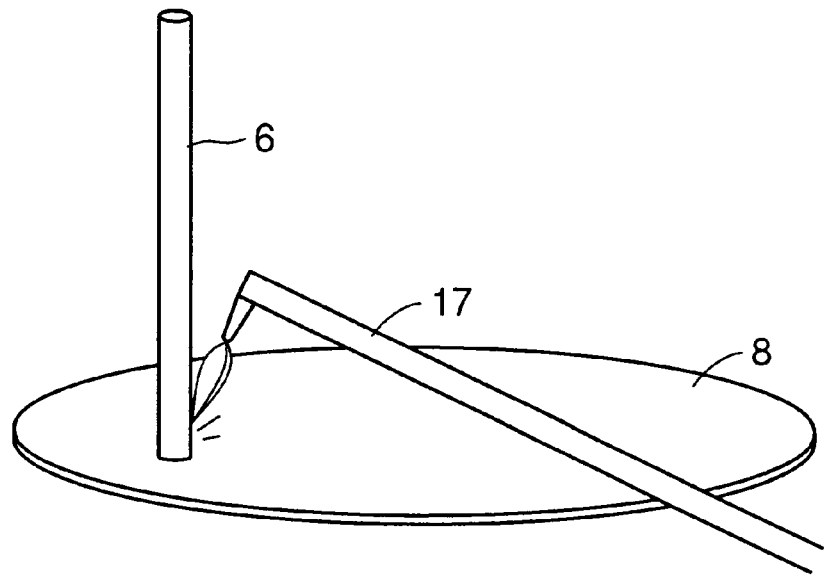
FIGS. 43 to 46 are perspective views showing first to fourth steps in a conventional method of assembling an auxiliary heat-insulating jig.
Figure 44:
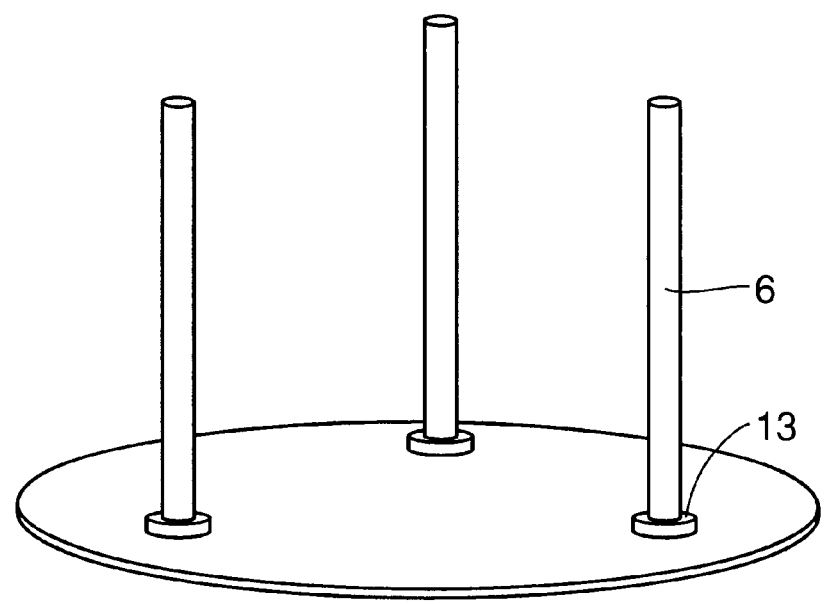
Figure 45:
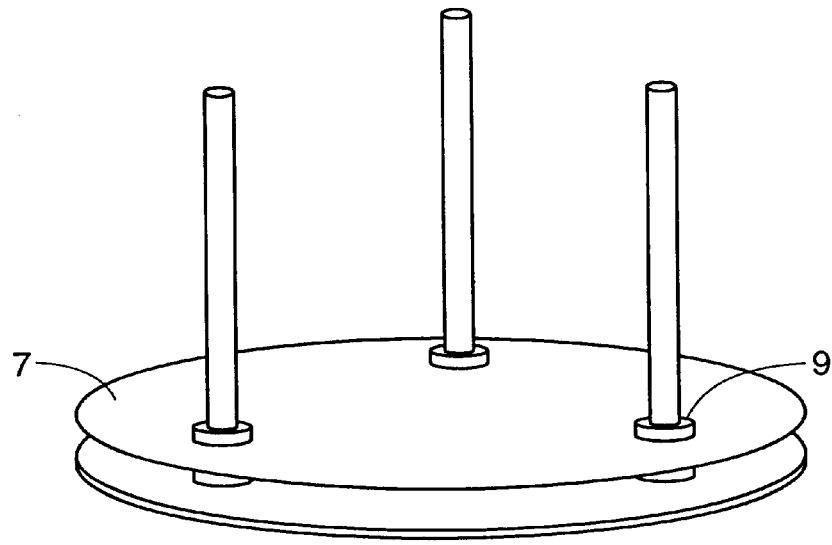
Figure 46:
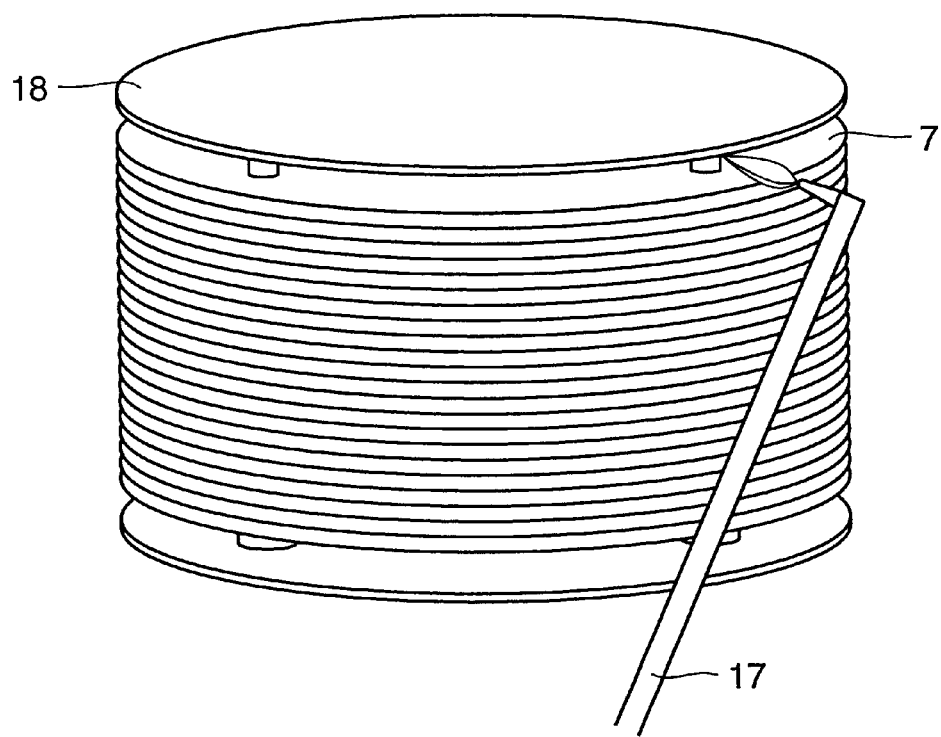

According to the present invention, an unexpected effect has also been attained. When an oxide film was formed in a high-speed temperature-control vertical heat treatment furnace provided with the inventive auxiliary heat-insulating jig, in-plane uniformity of the thickness of the oxide film was improved. A rectifying effect of reaction gas is conceivably one of the factors for this improvement. In a conventional apparatus, a gas discharge port 35 is provided on one side of the lowermost portion of a reaction chamber, as shown in FIG. 35. Gas moving downward from above is conceivably hindered by a heat-insulating cylinder and biased toward the gas discharge port 35. The inventive auxiliary heat-insulating jig 1 has a clearance under the wafer boat 4 as shown in FIG. 36, and hence gas moving toward a side opposite to a discharge port 35 moves down as such to escape from the discharge port 35 through the clearances between the plate insulators 7. The aforementioned oxide film was uniformly formed conceivably for this reason.

While three supports 6 are employed in each of the aforementioned embodiments, four or more supports may alternatively be employed. Further, not more than two supports may be employed so far as the same can stably hold the wafer boat 4. While the supports may not be cylindrical, hollow supports or those of transparent quartz transmitting radiant heat are unpreferable.

According to the present invention, as hereinabove described, plate insulators and spacers are separately formed. The intervals between the plate insulators depend on the thickness of the spacers. Therefore, the plate insulators and the spacers can be arranged at unweldable intervals.

Further, no welding is performed so that the thickness of the plate insulators can be reduced to a level allowing no level.

A number of thin plate insulators can be arranged at narrow intervals, and hence surface areas contributing to reflection of heat radiation can be increased within a limited space. Therefore, thermal capacity can be reduced and excellent heat insulation can be effectively attained.

The life of the auxiliary heat-insulating jig can be increased in employment under a high temperature by reinforcing the plate insulators.

Further, heat insulation can be improved by simply exchanging a conventional wafer boat with the wafer boat integrated with plate insulators.

The plate insulators having a thickness similar to that of silicon wafers can be readily mounted on an existing wafer boat, whereby no space for receiving the plate insulators may be newly formed but modification can be readily performed.

When the auxiliary heat-insulating jig or the wafer boat provided with plate insulators according to the present invention is applied to a high-speed temperature-control vertical heat treatment apparatus, the high-speed temperature-control vertical heat treatment apparatus can be modified to be capable of coping with a high temperature.

When the high-speed temperature-control vertical heat treatment apparatus can be modified to be capable of coping with a high temperature, all apparatuses in a semiconductor fabrication factory can be formed by apparatuses each treating a single lot at a time. Further, the fabrication balance of the factory can be improved and productivity can be remarkably increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An auxiliary heat-insulating jig, provided between a wafer boat and a heat-insulating jig in a vertical heat treatment apparatus comprising said wafer boat and said heat-insulating jig, comprising:
   a plurality of vertically arranged plate insulators, wherein said plate insulators are made of opaque quartz,
   reinforcing parts reinforcing said plate insulators are provided on at least single surfaces of said plate insulators, said reinforcing parts include:
   (a) portions, having a larger thickness than the remaining portions, radially extending from the central portions of said plate insulators, and/or
   (b) portions, having a larger thickness than the remaining portions, forming circumferences apart from the central portions of said plate insulators, and said reinforcing parts are integrally formed with said plate insulators.

2. The auxiliary heat-insulating jig according to claim 1, further comprising:
   a base,
   a plurality of supports vertically set up on said base,
   fixing means provided on the respective ones of said plurality of plate insulators for fixing said plurality of plate insulators in association with said supports, and
   a spacer detachably inserted between each pair of said plurality of vertically arranged plate insulators for defining a clearance therebetween.

3. The auxiliary heat-insulating jig according to claim 2, wherein said fixing means include:
   (a) through holes vertically passing through said plate insulators,
   (b) U-shaped notches provided on the outer peripheral potions of said plate insulators for receiving side portions of said supports,
   (c) semicircular notches provided on the outer peripheral potions of said plate insulators for receiving side portions of said supports, or
   (d) rectangular notches provided on the outer peripheral potions of said plate insulators for receiving side portions of said supports.

4. The auxiliary heat-insulating jig according to claim 1, wherein the thickness of said plate insulators is rendered substantially identical to the thickness of a semiconductor substrate.

5. The auxiliary heat-insulating jig according to claim 1, further comprising:
   a base,
   a plurality of supports vertically set up on said base, and
   fixing means provided on the respective ones of said plurality of plate insulators for fixing said plurality of plate insulators in association with said supports, wherein
      said plurality of plate insulators are engaged into said auxiliary heat-insulating jig through said fixing means, to be fixed.

6. An auxiliary heat-insulating jig mounted on a wafer boat, comprising a support provided on its side wall with a plurality of vertically arranged first notches for receiving semiconductor substrates in said first notches and supporting said semiconductor substrates, comprising:
   a plurality of vertically arranged plate insulators having a thickness rendered substantially identical to the thickness of said semiconductor substrates and provided with reinforcing parts on at least single surfaces thereof, wherein
   second notches are provided on the outer peripheral portions of said plate insulators for receiving an extension part of said support to be capable of fixing said plurality of plate insulators by engaging said second notches in first notches provided in said extension part of said support.

7. A wafer boat having an auxiliary heat-insulating jig mounted thereon, wherein
   said auxiliary heat-insulating jig includes a plurality of vertically arranged plate insulators, and
   said plate insulators are made of opaque quartz,
   reinforcing parts reinforcing said plate insulators are provided on at least single surfaces of said plate insulators, said reinforcing parts include:
   (a) portions, having a larger thickness than the remaining portions, radially extending from the central portions of said plate insulators, and/or
   (b) portions, having a larger thickness than the remaining portions, forming circumferences apart from the central portions of said plate insulators, and said reinforcing parts are integrally formed with said plate insulators.

8. A vertical heat treatment apparatus comprising:
   a wafer boat; and
   an auxiliary heat-insulating jig mounted on said wafer boat, wherein
   said auxiliary heat-insulating jig includes a plurality of vertically arranged plate insulators, and
   said plate insulators are made of opaque quartz,
   reinforcing parts reinforcing said plate insulators are provided on at least single surfaces of said plate insulators, said reinforcing parts include:
   (a) portions, having a larger thickness than the remaining portions, radially extending from the central portions of said plate insulators, and/or
   (b) portions, having a larger thickness than the remaining portions, forming circumferences apart from the central portions of said plate insulators, and
   said reinforcing parts are integrally formed with said plate insulators.

9. A vertical heat treatment apparatus comprising a wafer boat having an auxiliary heat-insulating jig mounted thereon, wherein
   said auxiliary heat-insulating jig includes a plurality of vertically arranged plate insulators, and
   said plate insulators are made of opaque quartz,
   reinforcing parts reinforcing said plate insulators are provided on at least single surfaces of said plate insulators, said reinforcing parts include:
   (a) portions, having a larger thickness than the remaining portions, radially extending from the central portions of said plate insulators, and/or
   (b) portions, having a larger thickness than the remaining portions, forming circumferences apart from the central portions of said plate insulators, and
   said reinforcing parts are integrally formed with said plate insulators.

10. A method of fabricating a semiconductor device, comprising the step of:
    heat treating the semiconductor device employing the vertical heat treatment apparatus according to claim 9.

* * * * *